(12) United States Patent
Tam

(10) Patent No.: US 10,103,133 B2
(45) Date of Patent: Oct. 16, 2018

(54) PACKAGING OF HIGH PERFORMANCE SYSTEM TOPOLOGY FOR NAND MEMORY SYSTEMS

(71) Applicant: SANDISK TECHNOLOGIES LLC, Plano, TX (US)

(72) Inventor: Eugene Jinglun Tam, Saratoga, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/659,065

(22) Filed: Jul. 25, 2017

(65) Prior Publication Data

US 2017/0323875 A1  Nov. 9, 2017

Related U.S. Application Data

(62) Division of application No. 13/904,770, filed on May 29, 2013, now Pat. No. 9,728,526.

(51) Int. Cl.
*G11C 5/06* (2006.01)
*H01L 25/18* (2006.01)

(52) U.S. Cl.
CPC ............ *H01L 25/18* (2013.01); *G11C 5/06* (2013.01); *H01L 2225/0651* (2013.01); *H01L 2225/06506* (2013.01); *H01L 2225/06562* (2013.01)

(58) Field of Classification Search
CPC ........... H01L 25/18; H01L 2225/06506; H01L 2225/0651; G11C 5/06

(Continued)

(56) References Cited

U.S. PATENT DOCUMENTS 5,070,032 A   12/1991  Yuan et al.
5,570,315 A   10/1996  Tanaka et al.
(Continued)

FOREIGN PATENT DOCUMENTS

WO   WO-2005/003880   1/2005
WO   WO-2006/115896   11/2006
(Continued)

OTHER PUBLICATIONS

Office Action issued on Chinese Application 201480021399.X, dated Nov. 16, 2017, English translation only.
(Continued)

*Primary Examiner* — Anthan Tran
(74) *Attorney, Agent, or Firm* — Foley & Lardner LLP

(57) ABSTRACT

A topology for memory circuits of a non-volatile memory system reduces capacitive loading. For a given channel, a single memory chip can be connected to the controller, but is in turn connected to multiple other memory devices that fan out in a tree-like structure, which can also fan back in to a single memory device. In addition to the usual circuitry, such as a memory arrays and associated peripheral circuitry, the memory chip also includes a flip-flop circuit and can function in several modes. The modes include a pass-through mode, where the main portions of the memory circuit are inactive and commands and data are passed through to other devices in the tree structure, and an active mode, where the main portions of the memory circuit are active and can receive and supply data. Reverse active and reverse pass-through modes, where data flows in the other direction, can also be used. The pads of the memory chip can be configurable to swap input and output pads to more efficiently form the memory chips into a package.

20 Claims, 20 Drawing Sheets

(58) Field of Classification Search
 USPC .............................. 365/63, 189.17; 711/103
 See application file for complete search history.

(56) References Cited

U.S. PATENT DOCUMENTS

| | | | |
|---|---|---|---|
| 5,903,495 | A | 5/1999 | Takeuchi et al. |
| 5,924,128 | A | 7/1999 | Luick et al. |
| 5,966,723 | A | 10/1999 | James et al. |
| 6,046,935 | A | 4/2000 | Takeuchi et al. |
| 6,378,018 | B1 | 4/2002 | Tsern et al. |
| 6,978,314 | B2 | 12/2005 | Tarr |
| 6,996,681 | B1 | 2/2006 | Autechaud |
| 7,477,526 | B1 | 1/2009 | Co |
| 7,697,332 | B2 | 4/2010 | Qu et al. |
| 7,769,781 | B1 | 8/2010 | Huntley |
| 2001/0042147 | A1 | 11/2001 | Adams et al. |
| 2002/0084458 | A1 | 7/2002 | Halbert et al. |
| 2003/0037216 | A1 | 2/2003 | Shibata et al. |
| 2003/0131211 | A1 | 7/2003 | Kuzmenka et al. |
| 2004/0103179 | A1 | 5/2004 | Damm et al. |
| 2004/0148482 | A1 | 7/2004 | Grundy et al. |
| 2004/0230751 | A1 | 11/2004 | Blake et al. |
| 2004/0230752 | A1 | 11/2004 | Blake et al. |
| 2004/0243769 | A1 | 12/2004 | Frame et al. |
| 2005/0030797 | A1 | 2/2005 | Pax et al. |
| 2006/0171244 | A1 | 8/2006 | Ando |
| 2006/0215525 | A1 | 9/2006 | Oyama et al. |
| 2006/0265533 | A1 | 11/2006 | Hobson et al. |
| 2007/0005922 | A1 | 1/2007 | Swaminathan et al. |
| 2007/0076502 | A1 | 4/2007 | Pyeon et al. |
| 2007/0109833 | A1 | 5/2007 | Pyeon et al. |
| 2007/0124532 | A1 | 5/2007 | Bennett |
| 2007/0233939 | A1 | 10/2007 | Kim |
| 2007/0239906 | A1 | 10/2007 | Vakil et al. |
| 2008/0049505 | A1 | 2/2008 | Kim et al. |
| 2008/0158969 | A1 | 7/2008 | Moogat et al. |
| 2008/0162790 | A1* | 7/2008 | Im .......................... G11C 5/02 711/103 |
| 2009/0006752 | A1 | 1/2009 | Bartley et al. |
| 2009/0006772 | A1 | 1/2009 | Bartley et al. |
| 2009/0070612 | A1 | 3/2009 | Adelman et al. |
| 2009/0157950 | A1 | 6/2009 | Selinger |
| 2009/0157977 | A1 | 6/2009 | Gregg et al. |
| 2009/0172257 | A1* | 7/2009 | Prins ................... G06F 13/1657 711/103 |
| 2009/0190482 | A1 | 7/2009 | Blair |
| 2010/0083028 | A1 | 4/2010 | Oh |
| 2010/0115172 | A1* | 5/2010 | Gillingham ......... G06F 13/4059 710/310 |
| 2010/0131700 | A1 | 5/2010 | Castillo |
| 2012/0246443 | A1 | 9/2012 | Meir et al. |
| 2012/0268991 | A1 | 10/2012 | Chiao |
| 2013/0145085 | A1 | 6/2013 | Yu et al. |
| 2013/0265067 | A1* | 10/2013 | Leedy ................ G01R 31/2894 324/750.01 |
| 2014/0082260 | A1 | 3/2014 | Oh et al. |
| 2014/0237176 | A1 | 8/2014 | Takefman et al. |
| 2014/0244980 | A1 | 8/2014 | Mortazavi |
| 2015/0180726 | A1 | 6/2015 | Asati et al. |

FOREIGN PATENT DOCUMENTS

| | | |
|---|---|---|
| WO | WO-2007/036048 | 4/2007 |
| WO | WO-2009/032751 | 3/2009 |

OTHER PUBLICATIONS

International Search Report and Written Opinion issued on PCT/US2014/036327, dated Dec. 2, 2014.
Non-Final Office Action issued on U.S. Appl. No. 13/904,770, dated Sep. 24, 2014.
Non-Final Office Action issued on U.S. Appl. No. 13/904,770 dated Mar. 14, 2017.
Office Action issued on Chinese Application 201480021399.X, dated May 3, 2017.

* cited by examiner

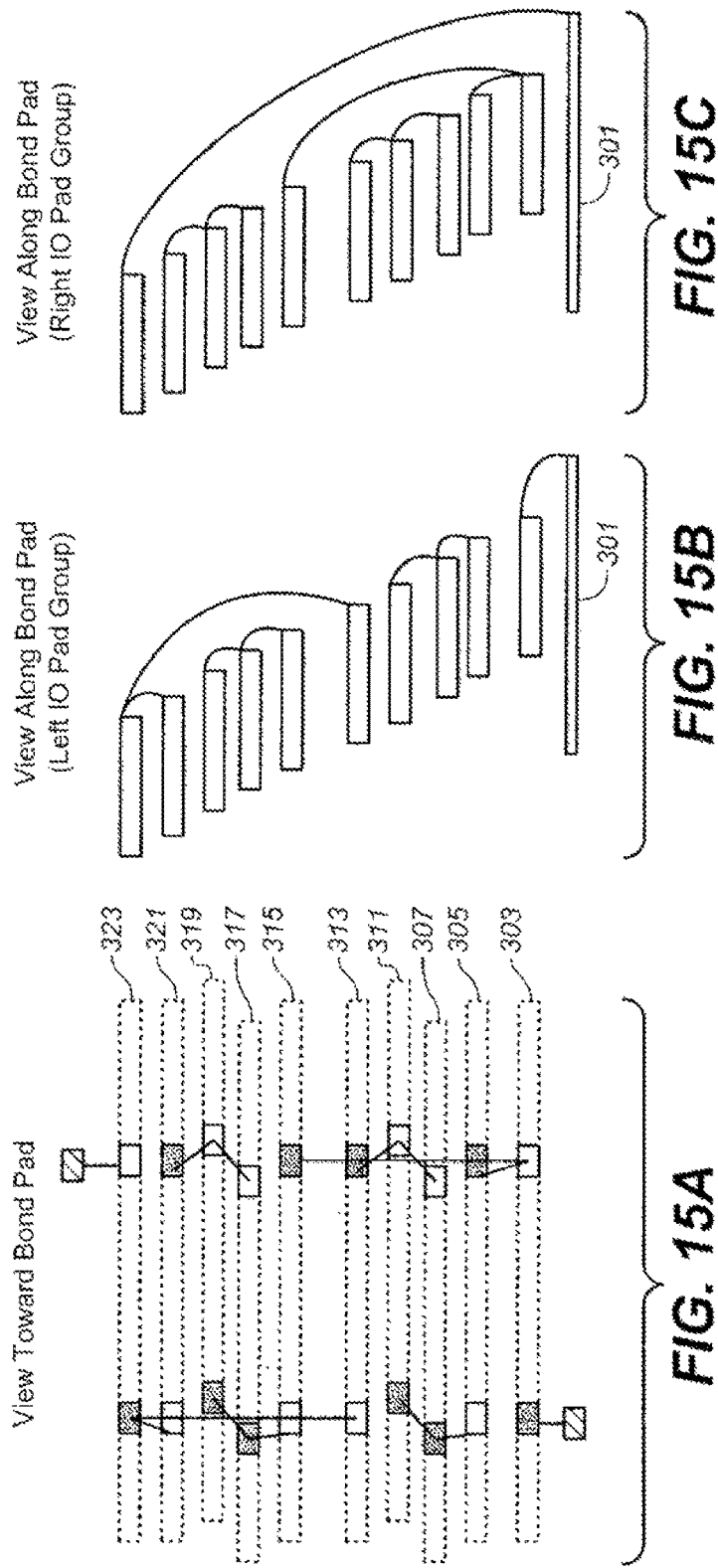

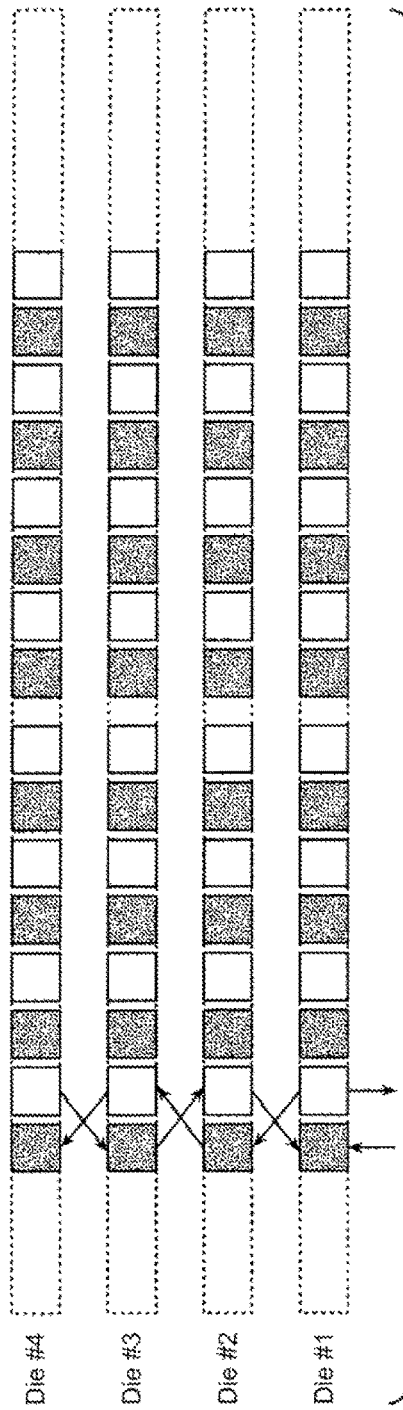
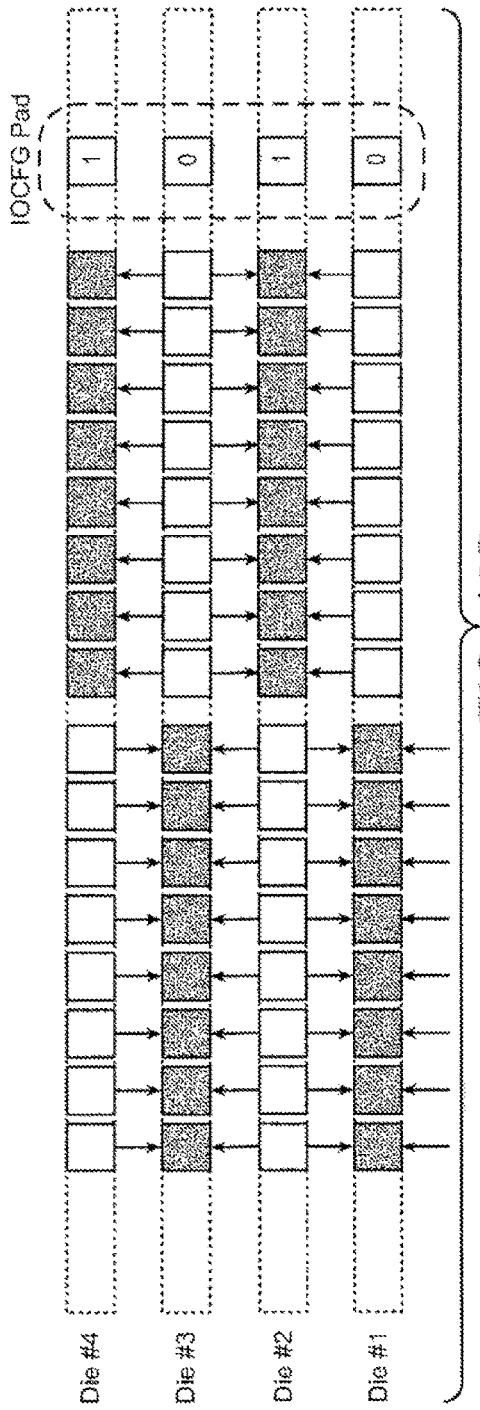

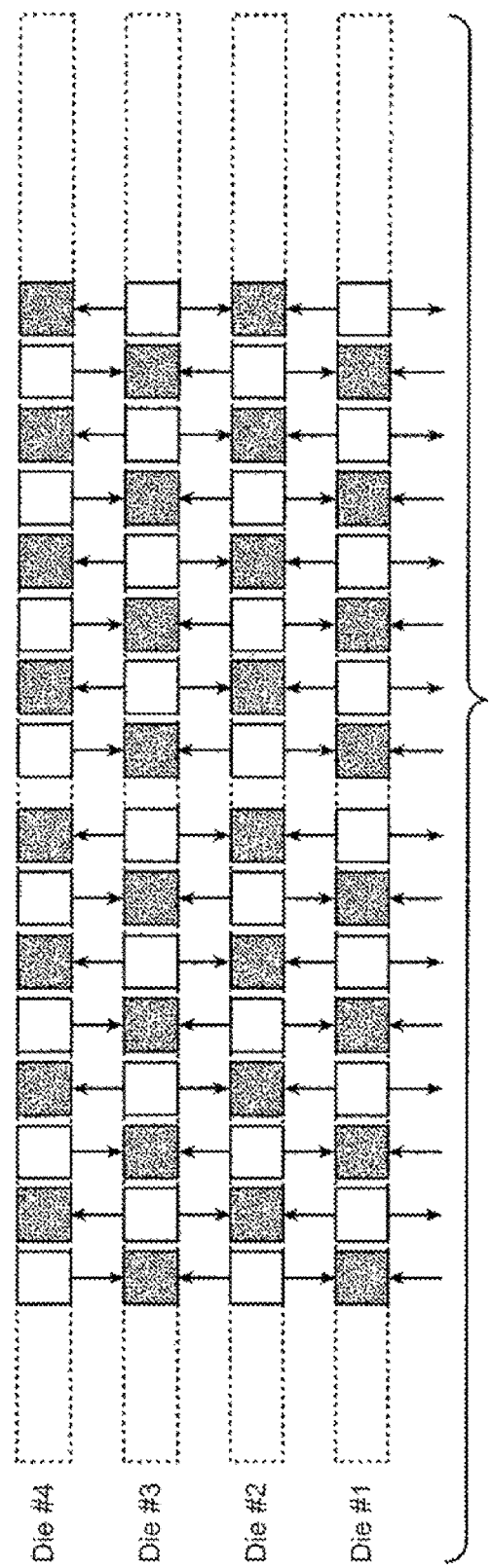

| Conventional | Die Group1 | Die Group2 |
|---|---|---|
| WPn | IN0 | OUT0 |
| WEn | IN1 | OUT1 |
| ALE | CLE/ALE | CLE/ALE |
| CLE | IN2 | OUT2 |
| VREF | IN3 | OUT3 |
| CEn | IN4 | OUT4 |
| RB | IN5 | OUT5 |
| PRENb | IN6 | OUT6 |
| CADD2 | IN7 | OUT7 |
| DQS | CKO | CKI |
| BDQS | CKOn | CKIn |
| REn | CKI | CKO |
| BREn | CKIn | CKOn |
| IO0 | OUT0 | IN0 |
| IO1 | OUT1 | IN1 |
| IO2 | OUT2 | IN2 |
| IO3 | OUT3 | IN3 |
| IO4 | OUT4 | IN4 |
| IO5 | OUT5 | IN5 |
| IO6 | OUT6 | IN6 |
| IO7 | OUT7 | IN7 |
| X1IO/CADD0 | SKO | SKI |
| SKn/CADD1 | SKI | SKO |
| VMON/IOCFG | VDD | VSS |

*FIG. 18A*

| Conventional | Die Group1 | Die Group2 |
|---|---|---|
| WPn | IN0 | OUT0 |
| WEn | OUT0 | IN0 |
| ALE | CLE/ALE | CLE/ALE |
| CLE | IN1 | OUT1 |
| VREF | OUT1 | IN1 |
| CEn | IN2 | OUT2 |
| RB | OUT2 | IN2 |
| PRENb | IN3 | OUT3 |
| CADD2 | OUT3 | IN3 |
| DQS | CKI | CKO |
| BDQS | CKO | CKI |
| REn | CKIn | CKOn |
| BREn | CKOn | CKIn |
| IO0 | IN4 | OUT4 |
| IO1 | OUT4 | IN4 |
| IO2 | IN5 | OUT5 |
| IO3 | OUT5 | IN5 |
| IO4 | IN6 | OUT6 |
| IO5 | OUT6 | IN6 |
| IO6 | IN7 | OUT7 |
| IO7 | OUT7 | IN7 |
| X1IO/CADD0 | SKO | SKI |
| SKn/CADD1 | SKI | SKO |
| VMON/IOCFG | VDD | VSS |

*FIG. 18B*

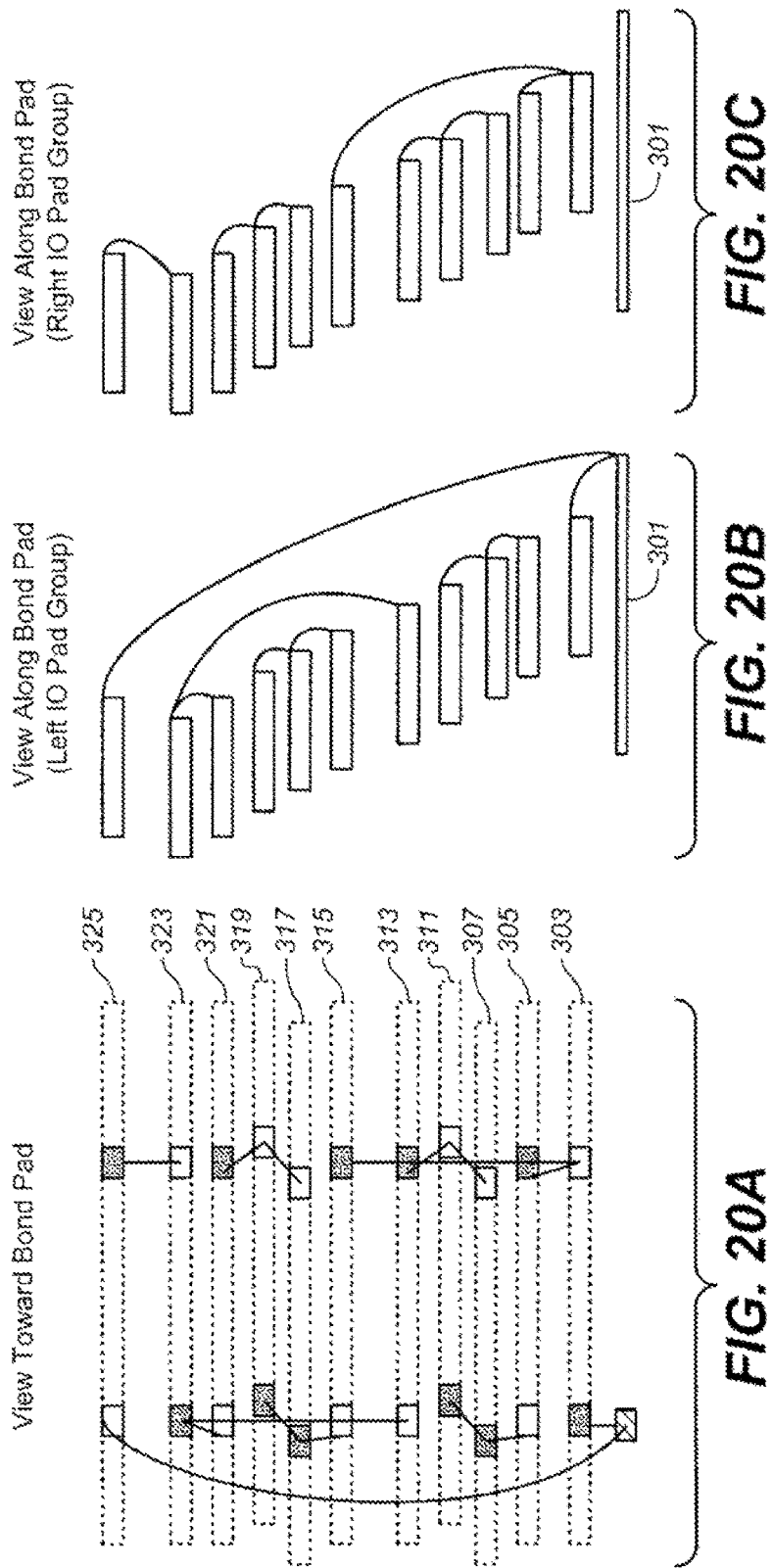

PACKAGING OF HIGH PERFORMANCE SYSTEM TOPOLOGY FOR NAND MEMORY SYSTEMS

CROSS-REFERENCE TO RELATED APPLICATIONS

This application is a divisional of U.S. application Ser. No. 13/904,770, filed on May 29, 2013, the entirety of which is incorporated by reference herein.

FIELD OF THE INVENTION

This invention pertains generally to the field of non-volatile memory and, more particularly, to the topology of the memory chips within such systems.

BACKGROUND

Non-volatile memory systems, such as those formed from NAND flash memory chips, typically include one or more controller chips connected to multiple memory chips. In some cases, such as in solid state drives (SSDs), the number of memory chips can be quite large. For example, with a NAND density of 128 Gb, or 16 GB, a 8 TB SSD drive with 100% over-provision (redundancy) would have 1024 NAND chips. If the system has 16 input/output (IO) channels, each channel has 64 NAND chips. The capacitive pin loading load of NAND chips impose limitations on system clock operation frequency to ensure signal integrity as the drivers may not be able to handle the cumulative load. Because of this, it is a challenge to push data transfer rates to higher frequencies.

SUMMARY OF THE INVENTION

According to a first set of general aspects, a non-volatile memory system includes a memory section having a plurality of non-volatile memory circuits and a bus structure. In the memory section, each of the memory circuits includes an array of non-volatile memory cells and a latch circuit, where the latch circuit is connectable to a bus input to receive data and commands therefrom and to a bus output to provide data and responses. In response to commands received on bus input the memory circuit can operate in a plurality of modes including: a pass-through mode, where the memory array is inactive and commands and data are passed by the latch circuit from the bus input to the bus output; and an active mode, in which the memory array is active and data can be transferred between the memory array and the bus input or bus output by the latch circuit. The bus structure connects the bus inputs and bus outputs of the non-volatile memory circuits for the transfer of data and commands. The bus structure includes an input bus for the memory section connected to the bus input of a first of the memory circuits, an output bus for the memory section connected to the bus output of a second of the memory circuit, and first and second intermediate busses. The first intermediate bus connects the bus output of the first memory circuit to the bus inputs of a first set of multiple other ones of the memory circuits, the first set not including the second memory circuit. The second intermediate bus connects the bus input of the second memory circuit to the bus outputs of a second set of multiple other ones of the memory circuits, the second set not including the first memory circuit.

Further aspects relate to a non-volatile memory system with a memory section having multiple non-volatile memory circuits. Each of the memory circuits includes an array of non-volatile memory cells and a latch circuit, where the latch circuit is connectable to a first input-output port to receive data and commands and provide data therefrom and to a second input-output port to provide data and commands and receive data therefrom. In response to commands received on the first input-output port the memory circuit can operate in a plurality of modes including: pass-through modes, wherein the memory array is inactive and commands and data are passed by the latch circuit from the first input-output port to the second input-output port or from the second input-output port to the first input output port; and active modes, in which the memory array is active and data can be transferred between the memory array and the first input-output port by the latch circuit. The memory section also has a bus structure connecting the first input-output ports and second input-output ports of the non-volatile memory circuits for the transfer of data and commands. The bus structure includes an initial bus segment for the memory section connected to the first input-output port of a first of the memory circuits and a first intermediate bus segment connecting the second input-output port of the first memory circuit to the first input-output ports of a first set of multiple other ones of the memory circuits.

Other aspects relate to a non-volatile memory integrated circuit having a plurality of external contact pads, primary circuitry portion, and a switching circuit. The external contact pads include a first set of a plurality of N external contact pads and a second set of N external contact pads. The primary circuitry portion includes a non-volatile memory array and associated peripheral circuitry and has, when operating in a first mode, N input lines and N output lines. The switching circuit is connected to the first and second sets of external contact pads connected to the input and output lines. The switching circuit can selectively attach the first and second sets of external contact pads to the input and output lines in either a first configuration, where the N input lines are attached to the first set of external contact pads and the N output lines are attached to the second set of external contact pads, or in a second configuration, where the N input lines are attached to the second set of external contact pads and the N output lines are attached to the first set of external contact pads.

Additional aspect concern a non-volatile memory package having multiple external bonding pads formed thereupon, the external bonding pads including a plurality of external input pads and a plurality of external output pads. The package contains multiple non-volatile memory chips each having a first set and a second set of N contact pins where each of the memory chips can be individually configured to operate in either a first configuration, where the first set of pins are input pins and the second set of pins are output pins, and a second configuration, where the first set of pins are output pins and the second set of pins are input pins. The memory chips include a first memory chip connected with the input pins thereof connected to the external input pads, a second memory chip connected with the output pins thereof connected to the external output pads, and one or more additional memory chips, where, aside from the input pins of the first memory chip and the output pins of the second memory chip, the first, second and additional memory chips are connected so that the output pins of each memory chip are connected to the input pins of one or more other memory chips and the input pins of each memory chip are connected to the output pins of one or more other memory chips. The memory chips are stacked with chips configured according to the first configuration interleaved with chips configured according to the second configuration.

Various aspects, advantages, features and embodiments of the present invention are included in the following description of exemplary examples thereof, whose description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 15A-C illustrate the connections between the input and output pads of the chips in a package from different views.

FIGS. 16A-C illustrate the pad connections in more detail for the multiple pads of a device.

FIGS. 18A and 18B show exemplary sets of pad assignments.

FIGS. 20A-C correspond to FIGS. 15A-C, but for an 11-chip package with both the input and output pads placed together on the package board.

DETAILED DESCRIPTION

As discussed in the Background, non-volatile memory systems having large numbers of memory chips, such as a NAND based solid state drive (SSD) can suffer from large amount of capacitive loading on pins of the memory chips, limiting transfer rates. The following addresses this problem by introducing a topology for the memory chips that can significantly reduce the capacitive loading, allowing for much higher IO data transfer rates.

Figure 1:
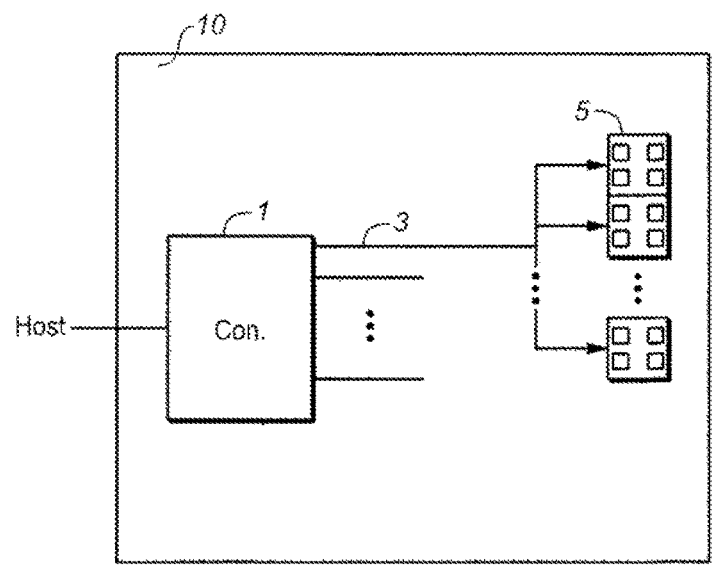
FIG. 1 is an example of a solid state drive having multiple channels, each with a large number of memory chips attached.
Figure 2:
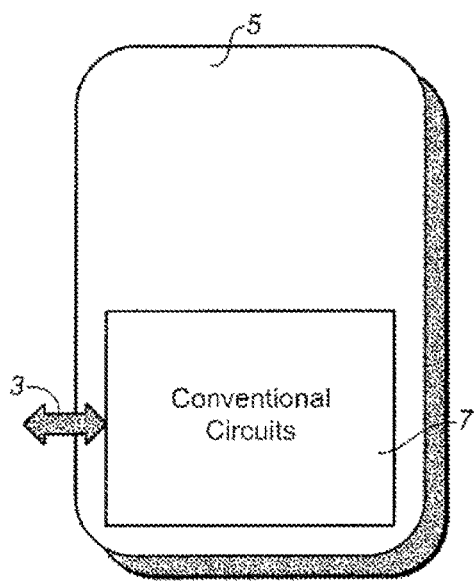
FIG. 2 is a schematic illustration of a NAND memory chip.

FIG. 1 can be used to consider the problem further. An SSD system 10 includes a controller 1 that has a number (16 in this example) of IO channels, each connected by a bus structure (such as shown IOC-1 3) to a number of memory chips, such as the NAND chip 5. Here, each channel has 64 memory chips for a total of 1024 chips, so that with a NAND density of 128 Gb, or 16 GB, 100% over-provision, this results in a 8 TB SSD drive. FIG. 2 is a schematic illustration of a NAND memory chip 5 as attached to the bus structure 3. Although the present discussion is given in the context of NAND type flash memory chips and as SSD drive, as the issue being dealt with is the capacitive loading on the bus structure, the techniques are not specific to this example. In particular, what is here referred to as the conventional circuitry portion 7 of the memory chip can be any sort of memory technology. To provide a concrete example for purposes of discussion, though, the following will be based on the NAND memory SSD drive example. More detail on NAND memory devices can be found in US patent and publication numbers 20080158969; U.S. Pat. Nos. 5,570,315; 5,903,495; and 6,046,935, for example. More detail on SSD drives is given in US patent publication number US20090172257, for example.

In a first set of aspects, the memory chip includes a new alternate or additional interface relative to the chip's existing interface. This interface can be controlled by an internal ROM fuse, for example. This new interface can also help to the overloading of pins with features that are found on convention interfaces. This additional interface is illustrated with respect to FIG. 3.

Figure 3:
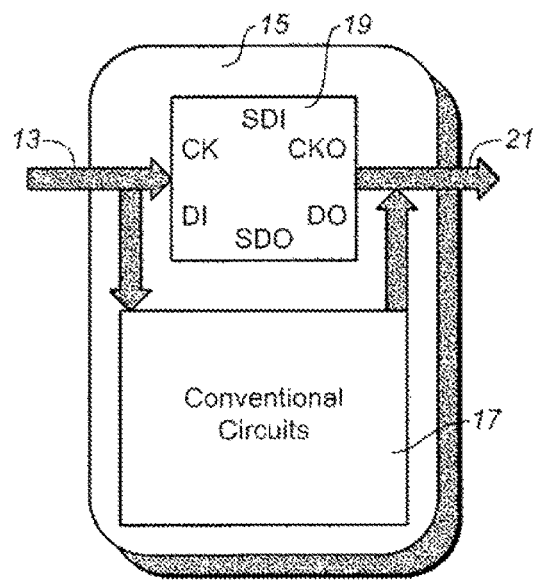
FIG. 3 schematically illustrates the inclusion of the alternate interface into the memory chip.

FIG. 3 schematically illustrates the inclusion of the alternate interface. The memory chip 15 again includes the "conventional" circuits 17 that would be found on a memory circuit, but now also includes as part of the additional interface a D flip-flop (DFF) 19 for receiving data and for receiving and buffering control signals. The bus connections to the chip 15 now include an input bus 13 and an output bus 21. (FIG. 3 shows the input bus 13 and output bus 21 on opposite sides of the chip for illustrative purposes, but in practice the corresponding pins can be variously located around the chip.) In the exemplary embodiment, for versatility the memory chip can be used with the standard interface, as in FIG. 2, or in this new arranged, where this can be controlled by way of an internal ROM fuse, for example. Under this new arrangement, the pin assignments would differ from the convention case, where rather that a set of, say, 8 pins being set aside for IO function, the input bus 16 would instead have 8 input lines and the output bus 21 would have 8 output lines.

Figure 4:
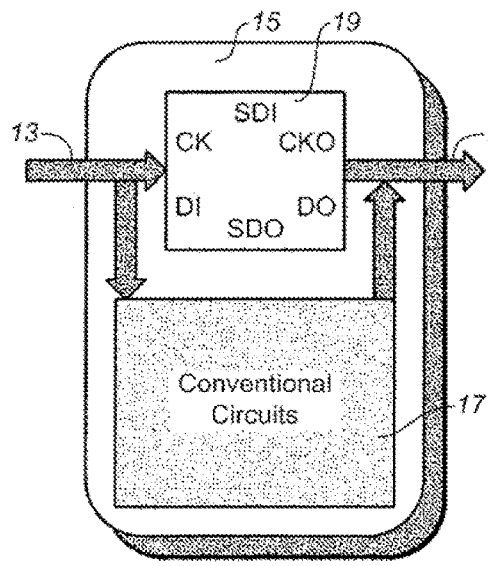
FIGS. 4-6 illustrate different modes of operation for the memory chip of FIG. 3.

The memory chip 15 can operate in an active mode and a pass-through mode, with it typically useful to also have a stand-by mode. These modes are illustrated schematically in FIGS. 4-6. FIG. 4 illustrates the standby mode, where the primary circuit portion 17 is not active and data is passed from the input bus 13 to the output bus 13. Addresses and commands, though, are clocked through the chip from the input bus 13 to the output bus 21.

Figure 5:
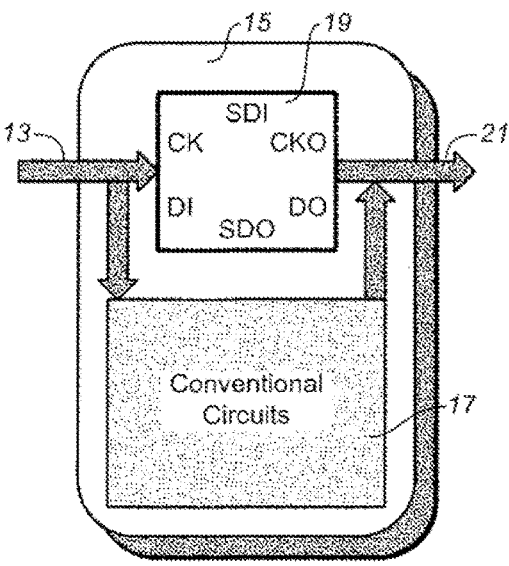
Figure 6:
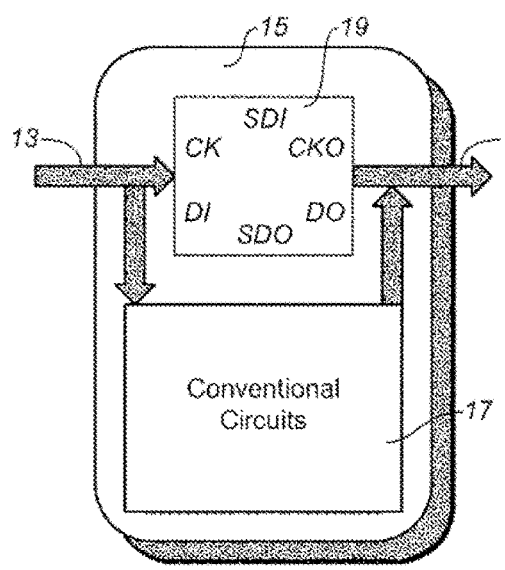

In the pass through mode, illustrated in FIG. 5, the circuit portion 17 is still inactive, but now in addition to passing commands, data is also passed though the DFF 19 from the input bus 13 to the output bus 21. In the active mode, schematically illustrated in FIG. 6, the primary circuit portion 17 is now active, as well as the DFF 19 of the interface. Addresses and commands can again pass through from the input to the output, but data does not pass when the device is selected: in the case of a write, data received on the input lines of the bus 13 would be transferred on to the array; and, in the case of a read, data would be transferred of out of the primary circuit portion 17 and on to the output bus 21.

Figure 7:
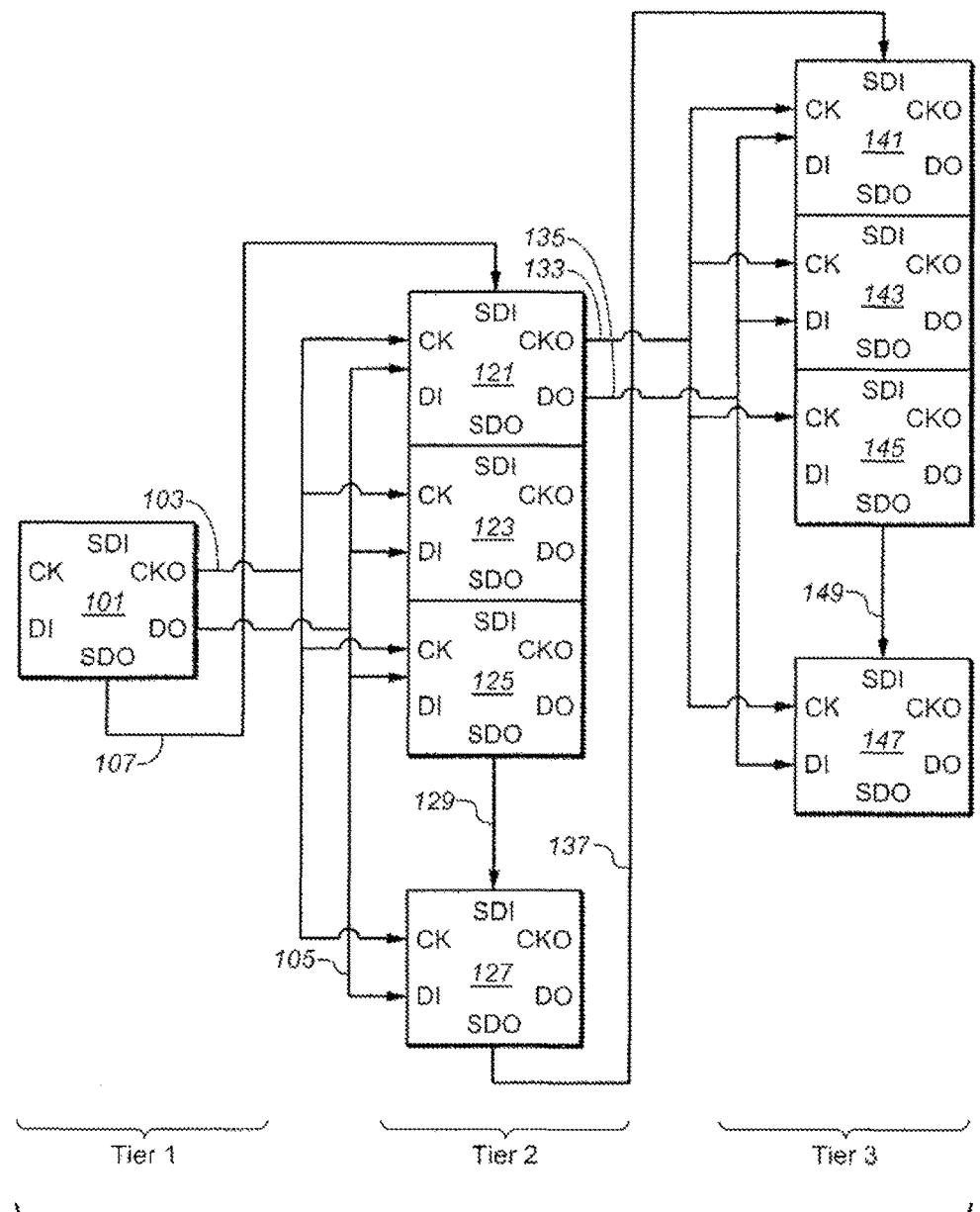
FIG. 7 illustrates an exemplary embodiment for a topology of a set of memory chips arranged into a tree type of structure.

The ability of the interface based on the DFF 19 to pass commands, addresses and data from the input bus 13 to the output bus 21 allows for the memory chips to be connected according to a topology that can significantly reduce the amount of capacitive loading on the pins. This is described with respect to FIG. 7. As shown in FIG. 7, a set of memory chips are arranged into a tree type of structure, shown here to a depth of three tiers with each branch having a depth of 4 shown chips, where here each of the chips is being represented by its DFF portion. A first chip 101 in the arrangement would be connected to receive commands, addresses and data the DI input and a clock signal at CK from the controller. This would then be the only one of the tree of memory chips for the channel whose input bus is driven by the controller.

The output data lines 105 from 101 at DO are then connected to the data input DI at each of the (in this example) four chips 121, 123, 125, 127 of the second tier. Similarly, the output clock from CKO of 101 is supplied along 105 to the clock input CKI of each of the second tier chips. This process is then repeated at tier 3, where each of the tier 2 chips are connected to drive a number (four again, in this example) of chips, where only the chips 141, 143, 145, 147 being fed by chip 121 are shown to simplify the diagram for purposes of discussion. The data out lines of chip 121 are connected over 135 to the data input pins of each of 141, 143, 145, 147, with the clock signal transferred from CKO of 121 over line 133 to the CKI pin of each of 141, 143, 145, 147. Under this arrangement, each device only drives four chips at most, relative to the arrangement of FIG. 1 where each IO channel from controller drives 64 chips. In addition to the tree-like structure of the tiers, the devices are also connected serially through their serially data outputs (SDO) and serial data inputs (DSI). The SDO output of chip 101 is carried over the line 107 to a first of the chips of the second tier, which are all connected serially, as is shown explicitly at 129. The last chip of tier 2 then has its SDO connected over 137 to the SDI input of the first of the chips in the series for tier 3, and so on, where one of the serial connections of tier 3 is shown explicitly at 149. The use of the serial clock can then be used in the selecting of the desired device.

Figure 8:
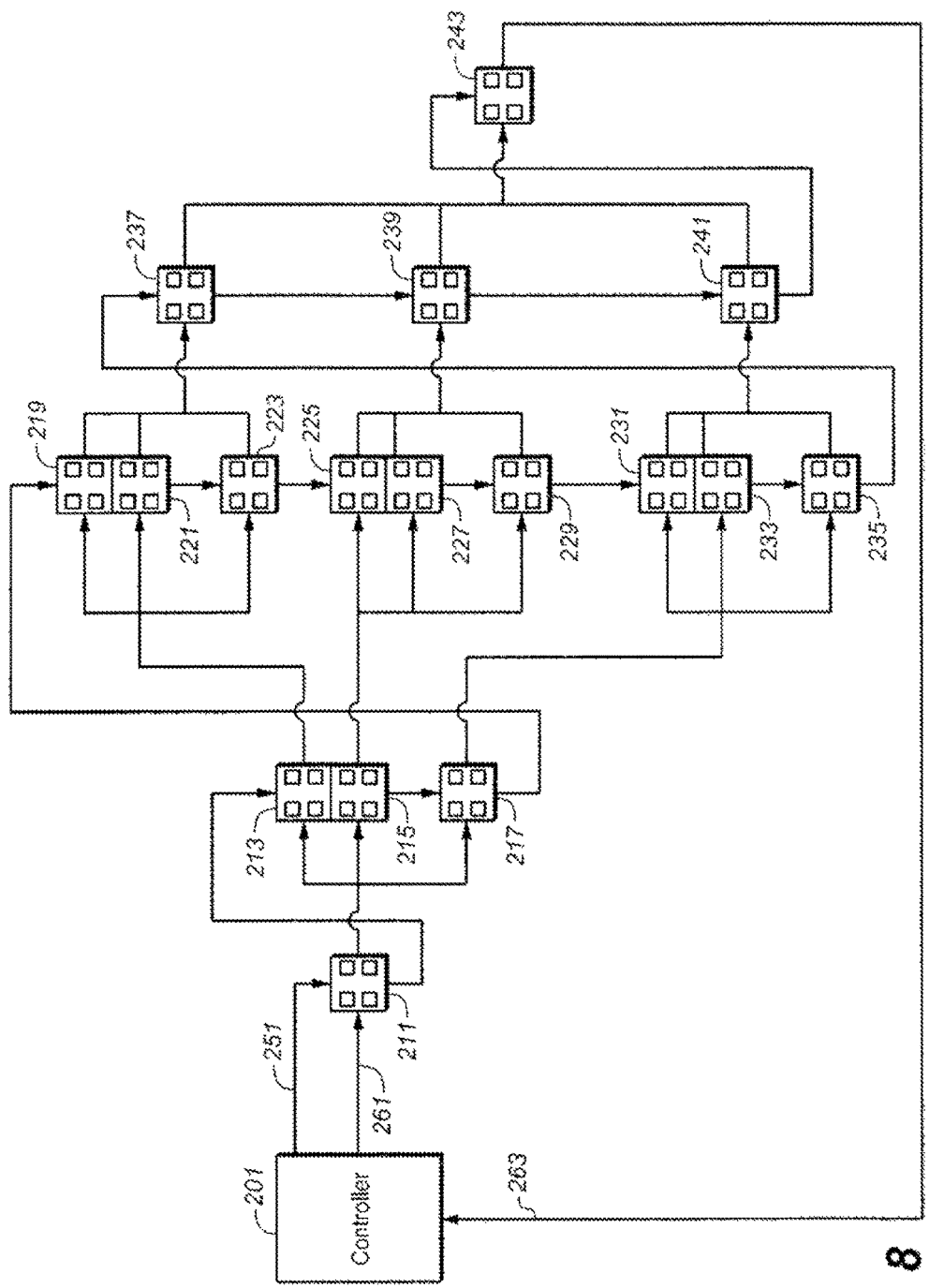
FIG. 8 shows a fuller development of the topology of the memory circuits within the memory system.

FIG. 8 shows a fuller development of the topology of the memory circuits within the memory system. In particular, this example only shows a single one of the IO channels from the controller 201 connected to a memory section having the memory chips connected according to a tree-like topology. This example for the memory section has five tiers that branch out with a branching ration of 3 at the second and third tiers, before shrinking back down in the last two stages. This particular example is symmetric both respect to how it branches out and then back in and in that the branching ratio for each chip, whether out or in, is the same. Although this symmetric is generally preferable in many cases as it more evenly distributes loading, other less symmetric arrangements can also be used.

In the exemplary arrangement of FIG. 8, the controller 201 is only directly by the IO channel output bus to the first chip 211 in the tree structure. (In FIG. 8, each memory device is again represented only by the DFF of its interface.) Here the portion of the bus structure 261 includes both the data and clock input, DI and CK. The serial clock signal is shown separated out from the other command, address, and data signal to illustrate its serial structure, as opposed to the tree structure used by the other lines. The segments of the main bus then branch from the first to the second, and second to the third tier as described above with respect to FIG. 7, and then, going from the third to the fourth and fourth to fifth tier, mirror this arrangement by fanning back in to the last device 241. The output bus section 263 from the last tier is then the input for the IO channel. The serial output bus 251 from the controller then works its way serially through the tiers and serially within each of the tiers.

Figure 9:
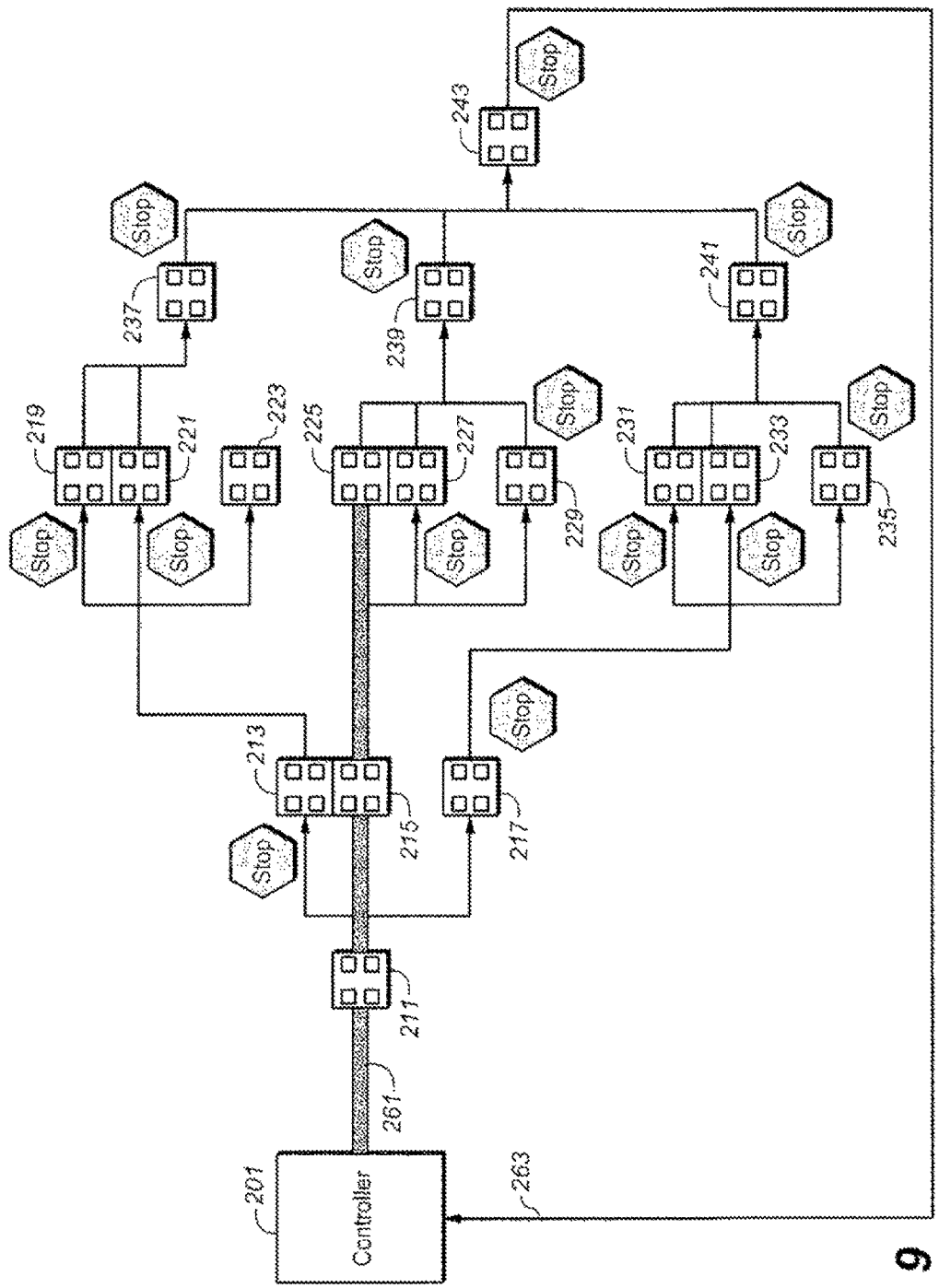
FIGS. 9 and 10 respectively show the flow of data in a write and a read operation for the elements of FIG. 8.

FIG. 9 shows the same elements as in FIG. 8, but without explicitly including the serial connections, and can be used to illustrate the flow of data for a write operation and how the different device modes are used. In this example, device 225 in the third tier is selected for a write operation. Consequently, device 225 is selected and placed in the active mode. As the path from the controller 201 to device 225 passes through chips 211 and 215, these need to pass the data as well as any commands and addresses and are in the pass-through mode. Any of the other devices that are not needed can then sleep in the stand-by mode, not passing data and saving power. As stand-by mode allows the any commands to pass, any status signals needing to be returned to the controller can pass through devices 239 and 243 and back along section 263 of the bus structure.

Figure 10:
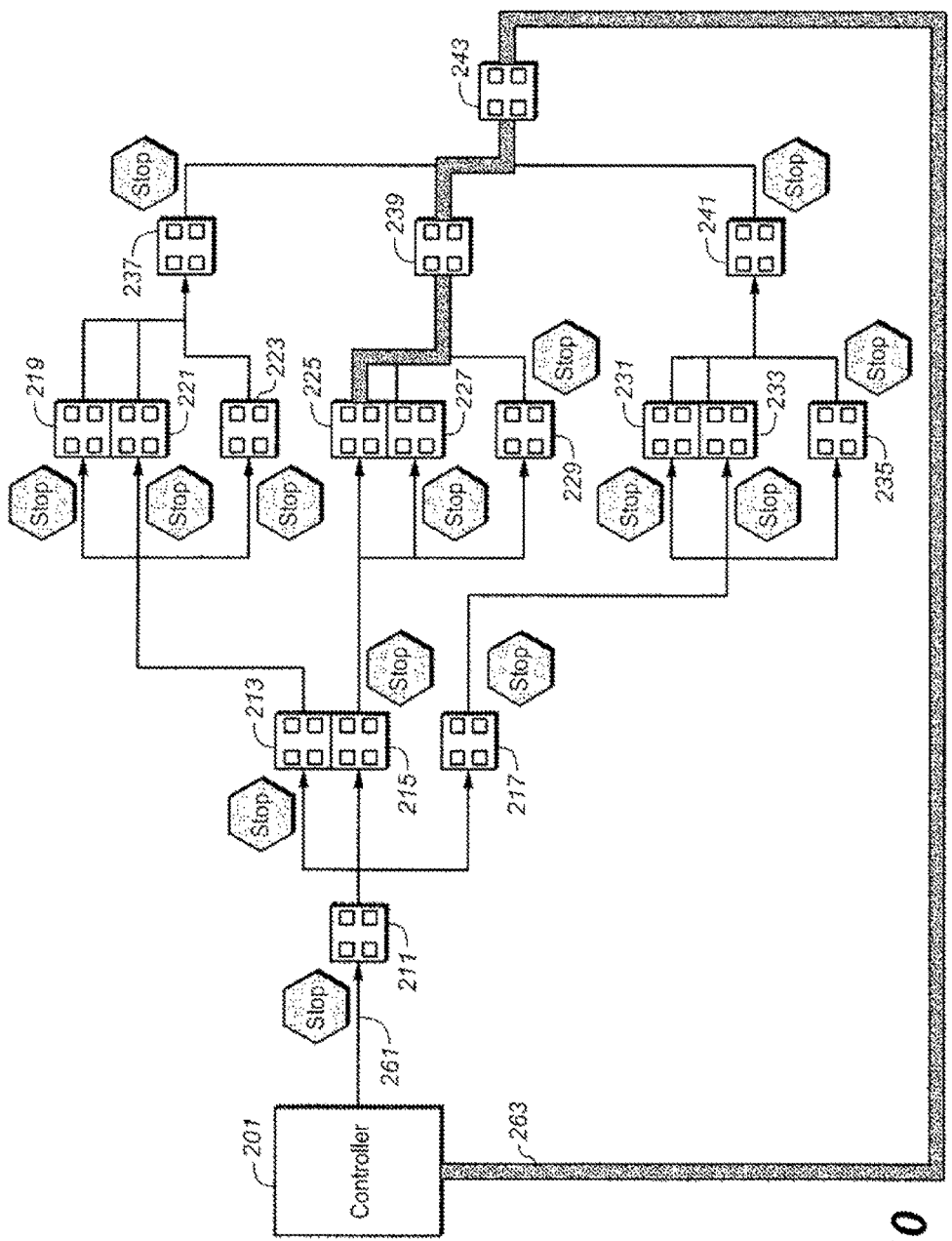

FIG. 10 illustrates the read counterpart to the write operation of FIG. 9. Device 225 in the third tier is again selected, but this time for a read operation, and is correspondingly in the active mode. As devices 239 and 243 need to pass the data back to the controller over bus segment 263, they will be in the pass-through mode. The rest of the memory devices can sleep to save on power, where chips 211 and 215 pass the commands and addresses to the selected device 225.

Figure 11:
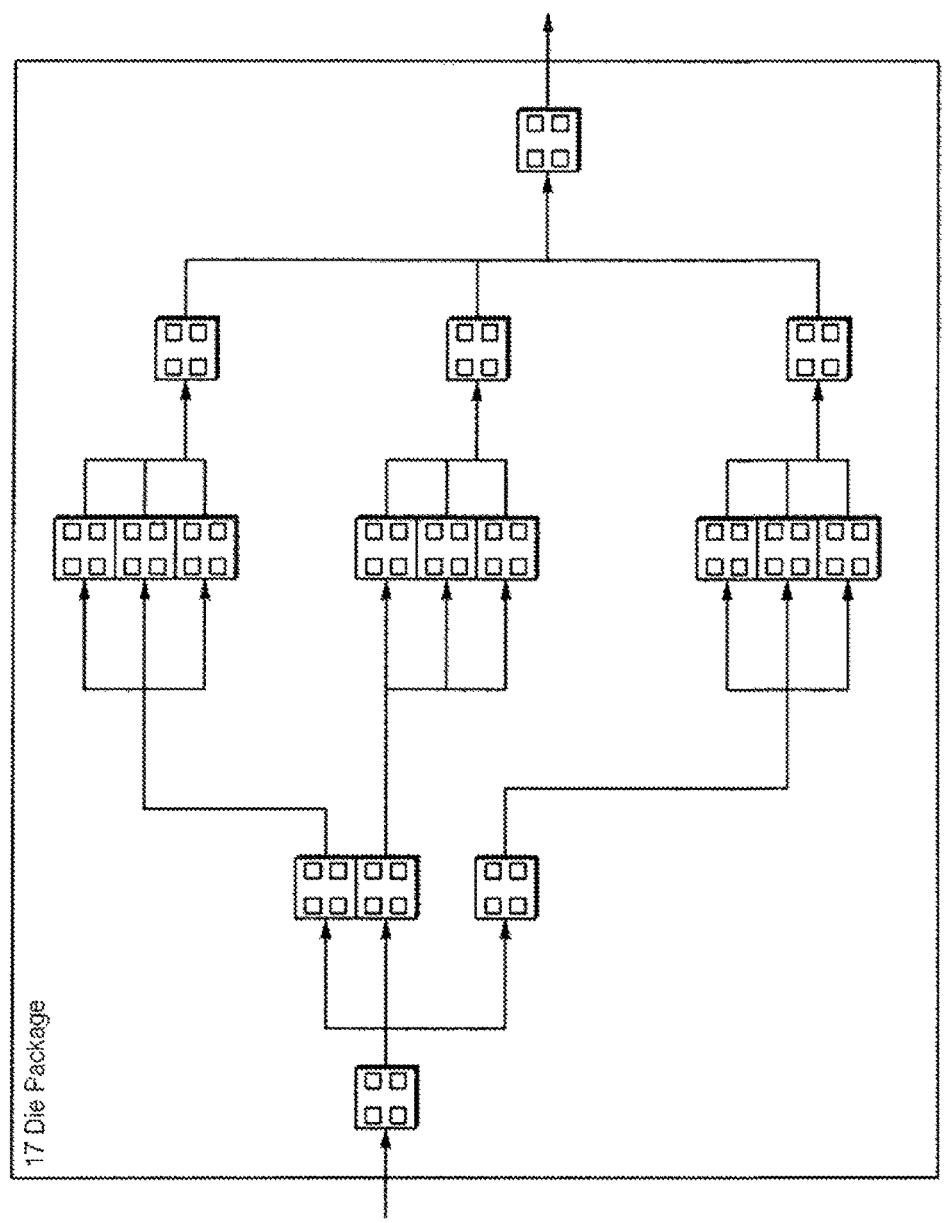
FIG. 11 shows the memory section of FIG. 8 arranged into a single package.
Figure 12:
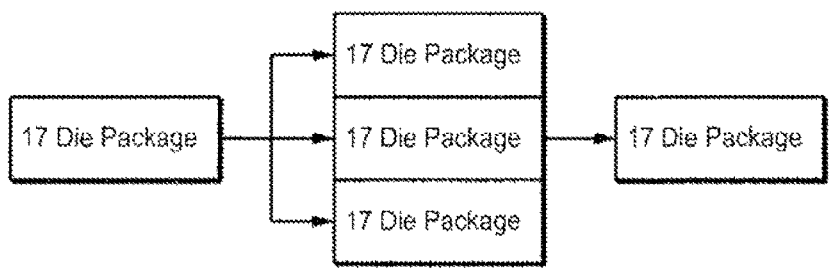
FIG. 12 illustrates how the packages of FIG. 11 can be arranged into a tree structure.

The memory section of FIG. 8 can be arranged into a single package, as shown in FIG. 11. Here the 17 die are formed into a single, 17 die package. As the input is only supplied to a single chip, the input loading is only one memory chip. Similarly, the output loading is only a single chip. The pin count is also corresponding reduced relative to a package where all of the chips directly attach to the bus structure. The internal loading is 1 memory chip driving at most 3 other chips. For a larger memory section, the packages also themselves can be arranged into a tree structure as shown in FIG. 12. Arranged in three tiers with a fan out of three, the 5 17 die packages can provide a channel with a total of 85 dies, again with an output and input loading of only a single device and an internal loading of no more than 3 devices. The structures of FIG. 12 can then themselves be arranged into a tree structure and the board level for an even larger capacity memory channel.

Figure 13:
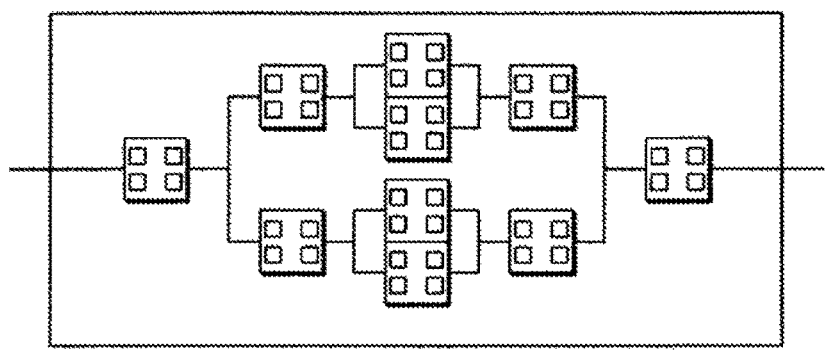
FIG. 13 shows another package embodiment, with 5 tiers and a fan out of 2, resulting in a 10 die package.
Figure 14:
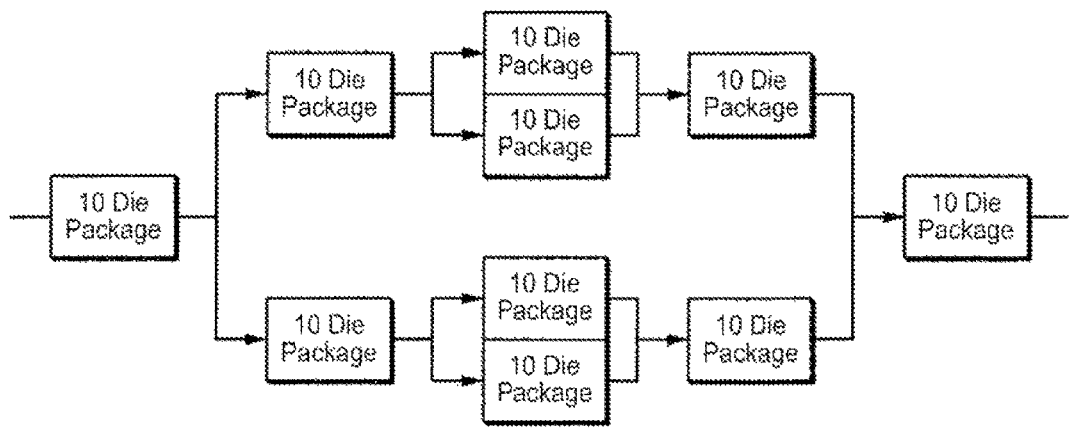
FIG. 14 illustrates the 10 die packages of FIG. 13 arranged into a 5 tiers with a fan out of two, for a total of 100 dies.

FIG. 13 looks at another package embodiment, which again has 5 tiers, but with a fan out of 2, resulting in a 10 die package. These can 10 die packages can then also be arranged into a 5 tiers with a fan out of two, for a total of 100 dies, as shown in FIG. 14. Consequently, using 16 channels supporting a total of 1600 dies would provide for 25.6 TB of storage based upon 16 GB dies. A 6 TB system with 100% over-provisioning can similarly be built with only 8 channels.

Within the package, the input and output pad sets can be swapped from chip to chip to more efficiently implement the topology. This can shorten and simplify the connections between the outputs of one tier with the inputs of the following tier. One exemplary embodiment for the 10 die package of FIG. 13 is illustrated schematically with respect to FIGS. 15A-C. FIGS. 15A-C show the 10 chips (303, 305, 307, . . . , 323) stacked up on the package board 301. FIG. 15A is a view from the front, toward the bond pads with the input pads shown in black, the output pads as white, and the gray pads at top and bottom are those for the package. Here the collective input and output pads are each represented by a single pad, one to the right and one to the left of the edge of each chip. FIG. 15B then would be the view along the bond pad of the stack from the left hand side showing only the left IO pad group. FIG. 15C is then the right hand side counterpart of FIG. 15B. For example, as shown on the fright side of FIG. 15A and in FIG. 15B, the bottom chip 303 has its input pads connected to the packages input pads. As shown on the left side of FIG. 15B and in FIG. 15C, the output pads of 303 are then connected to the inputs of 305 and 315 for the fan out of two. The other connections are similarly represented.

As noted, FIGS. 15A-C represented each of the input and output pads by a single collective pad. FIGS. 16A and 16B illustrate the situation in more detail for the multiple pads of a device, here in an example with 8 each for input and output for four of the dies, where both sets are grouped together. FIG. 16A illustrates the problems that can arise without the swapping of input and output pads, as the bonding wires would need to be constantly crossing between chips in the package, makings implement the desired topology very difficult on the package level. To solve this packaging issue, the pads belonging to the same pipelines can be aligned as illustrated in FIG. 16B. Both arrangements of the pads can use the same version of the chip, but the sets of pads can used either for input or output. The differentiation between input and output can be done several ways, such as through a command, an internal fuse control, or through the bonding pad. In the preferred embodiment, a bonding pad is used, which can be set at either Vcc or Vss to determine which set is for input and which is for output. This is illustrated in FIG. 16B by the configuration pad IOCFG, that can be used to configure which pad group is used for input and which is used for output. In FIG. 16B, the elements of each set are shown to be adjacent to each other, but these may distributed differently; for example, they could alternate as in FIG. 16A, but with the assignments of dies 2 and 4 swapped, such as is shown in FIG. 16C. In FIG. 16C, the configuration of the sets of pads can be done similarly to as described with respect to FIG. 16B, such as with a configuration pad IOCFG (not shown in FIG. 16C).

Figure 17:
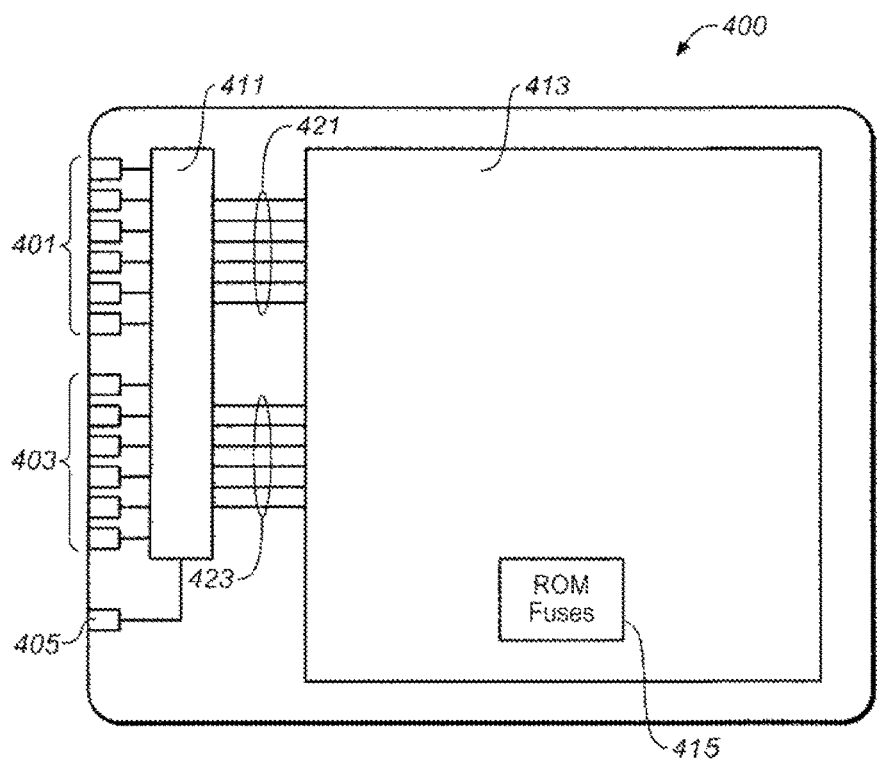
FIG. 17 is a simplified box diagram to illustrate an example of how the swapping of input and output pads can be implemented.

FIG. 17 is a simplified box diagram to illustrate an example of how this swapping of input and output pads can be implemented. A memory chip 400 has a series of pads represented 401, 403 and 405. The pads include the input output configuration IOCFG pad 405 and the two equal sets 401 and 403 of pads that are connected to the switchable connection circuit 411. The other elements of the circuit are grouped together as block 413 with a set of output lines 421 and a set of 423. Based on the level at the IOCFG pad 405, the lines 421 can be attached to the pad set 401 or the pad set 403, with the lines 423 going to the other set. Although the exemplary embodiment uses a specific bonding pad to determine the connection, other embodiments can be based on a command or internal fuse control.

Both in FIG. 17 and in FIG. 16B, the elements of each set are shown to be adjacent to each other, but these may distributed differently; for example, they could alternate as in FIG. 16C, but with the assignments of dies 2 and 4 swapped. This is illustrated in FIGS. 18A and 18B that show an exemplary set pad assignments for a more conventional arrangement (in the first column) and then the pad assignments for the case of a swappable set of input and output pads. The Die Group 1 column shows one alignment, here implemented by setting the IOCFG pad to VDD (bottom row), and the Die Group 2 column shows the swapped alignments, here implemented by setting the IOCFG pad to VSS. In the conventional assignments, a number of pads (such as 1O0-1O7) function as input-output pads, while in the other columns a number of pads have specific input or output assignments, where these are swapped based on the on the IOCFG level. (Note that although most pads swap depending on their group assignment, the latch enable signal, CLE/ALE, is the same in both assignments.) In FIG. 18A, the IN and OUT pads are grouped together, as illustrated in FIG. 16B, while FIG. 18B illustrates an interleaved arrangement, similar to FIG. 16B, but with swapping between Die Groups 1 and 2. Additionally, as shown in FIGS. 16B and 17, all of the pads except the IOCFG pads swap, but there can also be other pins (not shown), such as a clock signal or supply level, that go straight through and stay with the same pad assignment independently of the IOCFG level.

Figure 19:
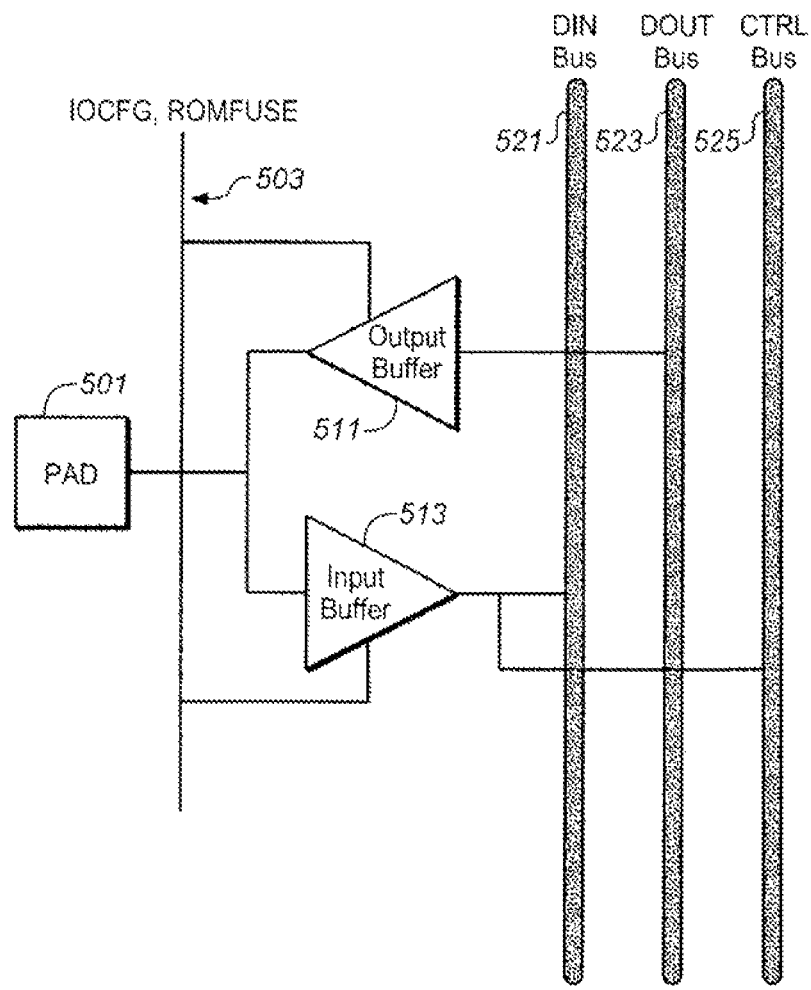
FIG. 19 looks at the swapping mechanism for a given pad in more detail.

FIG. 19 looks at the swapping mechanism for a given pad in more detail. Pad 501 is one of the swappable pads of the device, which here has the internal data-in DIN bus 521, data-out DOUT bus 523, and control CTRL bus 525. These buses are then connectable to the pad 501 through either an output buffer 511 or an input buffer 513. Based on the value on line 503, such as set by a ROMFUSE or the IOCFG, the pad 501 either functions as an input to supply data and commands to the DIN 521 and CTRL 525 buses or as an output to receive data from the DOUT bus 523.

As noted above, in the exemplary embodiment the memory chip can be operated in one mode with the pins assigned as developed above, with a number of pins being set aside as input bus lines and a similar number set aside as output bus lines, or in mode using a standard interface, as in FIG. 2 and with pad assignments such as in the "conventional" columns of FIGS. 18A and 18B. This can be controlled by way of an internal ROM fuse, for example, such as those represented at 415 of FIG. 17. This increases the versatility of the chip. As the need to swap the connections to the pads 401 and 403 would not be needed when the pads are assigned in the conventional mode, the swap function of 411 would not be used and the pad 405 would be used and could be reassigned to a different function the conventional pad assignment mode. Although the sort of tree like structure described above can be optimal for large size systems, for smaller systems the conventional assignments can be preferable for medium or smaller sized systems.

Figure 21:
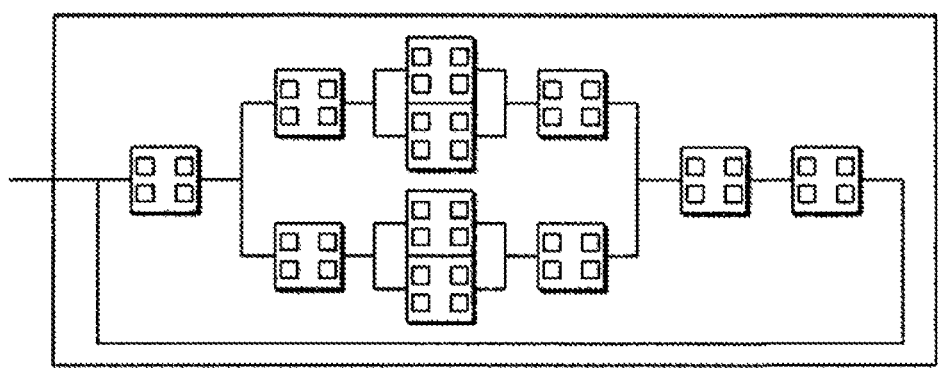
FIG. 21 illustrates a corresponding topology of the chips for an 11-chip package.

FIGS. 20A-C correspond to FIGS. 15A-C, but with an alternate assignment of pads with both the input and output pads placed together on the package board 301. More specifically, the lower chips are arranged the same, but with one more chip 325 added, making a 11-chip package. In this arrangement, the input of the lowest chip 303 and the output of the top chip 325 are both to the right. FIG. 21 then illustrates the corresponding topology of the chips in a package. As with 10 die package of FIG. 13, this alternate embodiment also uses a maximum fan-out of 2, but includes the last chip to the left whose output now also lies along the left side of the package of this alternate embodiment. As noted above, the tree structure need not be symmetric and in other embodiments, other or additional 1-1 chip arrangements can be added before or after the fan out or even in the central portions.

Figure 22:
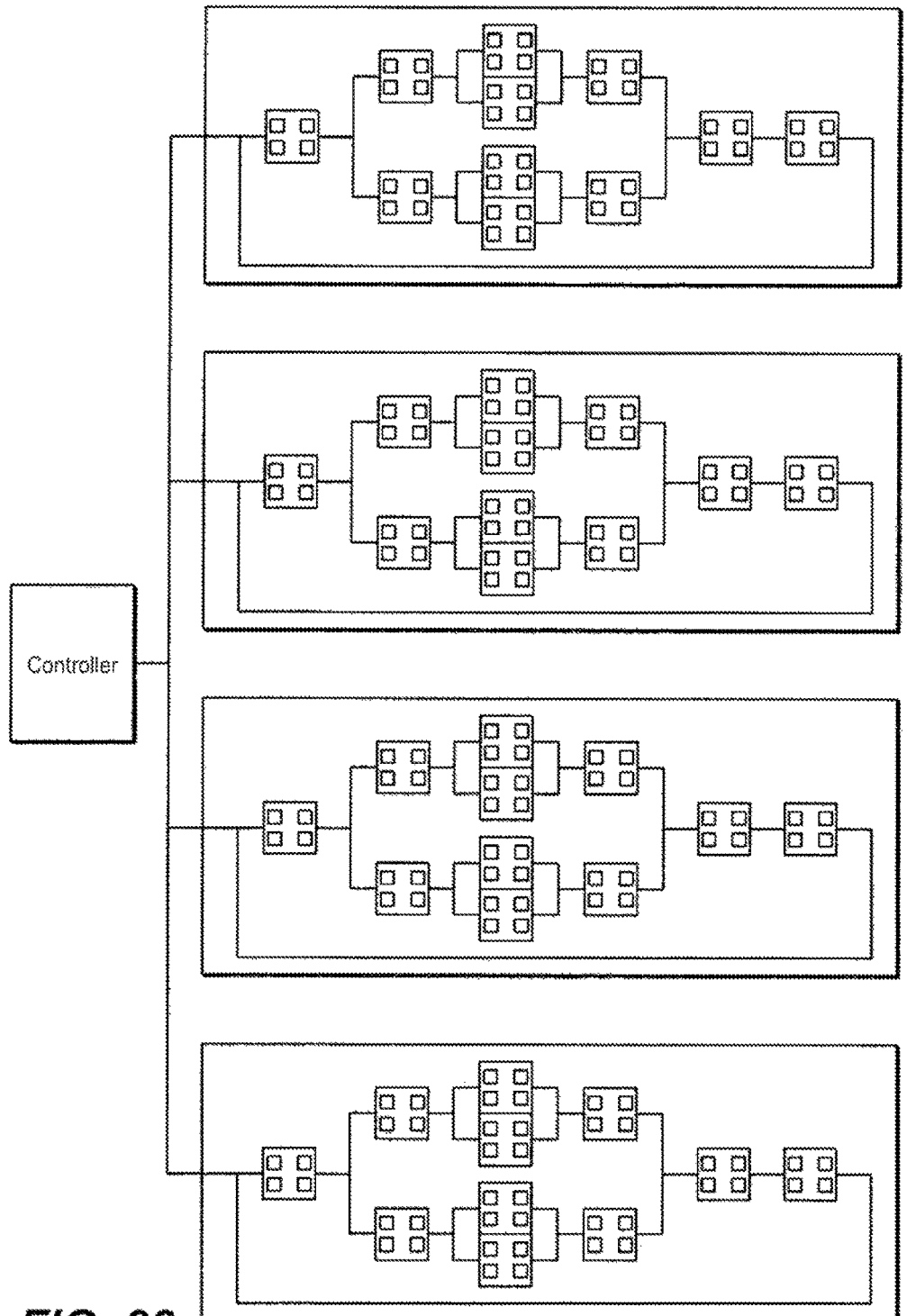
FIG. 22 illustrates an embodiment of a memory system of four 11-die packages connected to the same port

FIG. 22 illustrates an embodiment of a memory system of four 11-die packages as shown in FIG. 21 all connected to the same port: The fan-out is only 4 on the controller, but 2 inside package, so that maximum total fan-out is four. This results in 44 dies on the same channel, which, under the conventional arrangement of FIG. 1 would need a fan-out of 44.

Figure 23A:
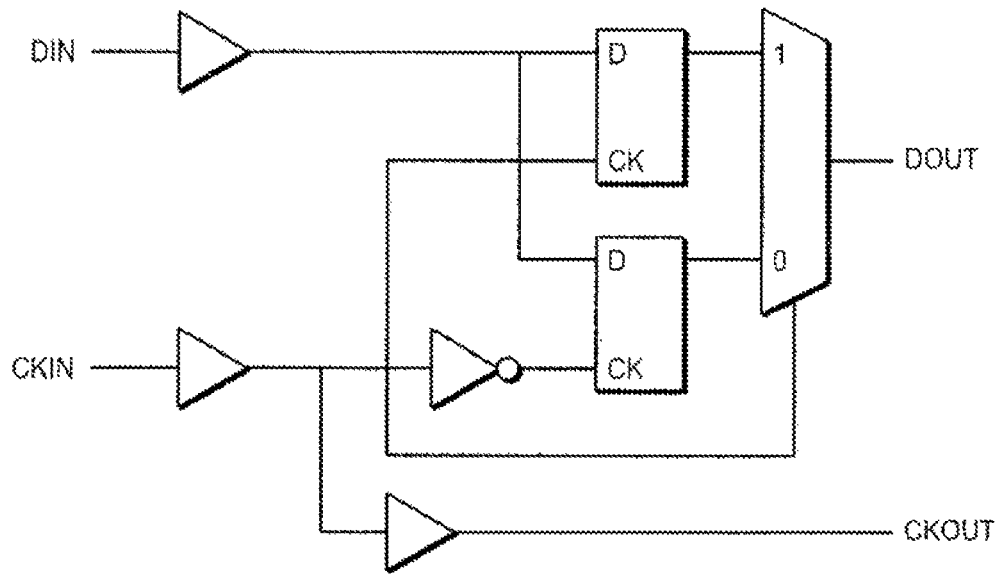
FIGS. 23A and 23B show two exemplary embodiments of circuits for data propagation with re-synchronization.
Figure 23B:
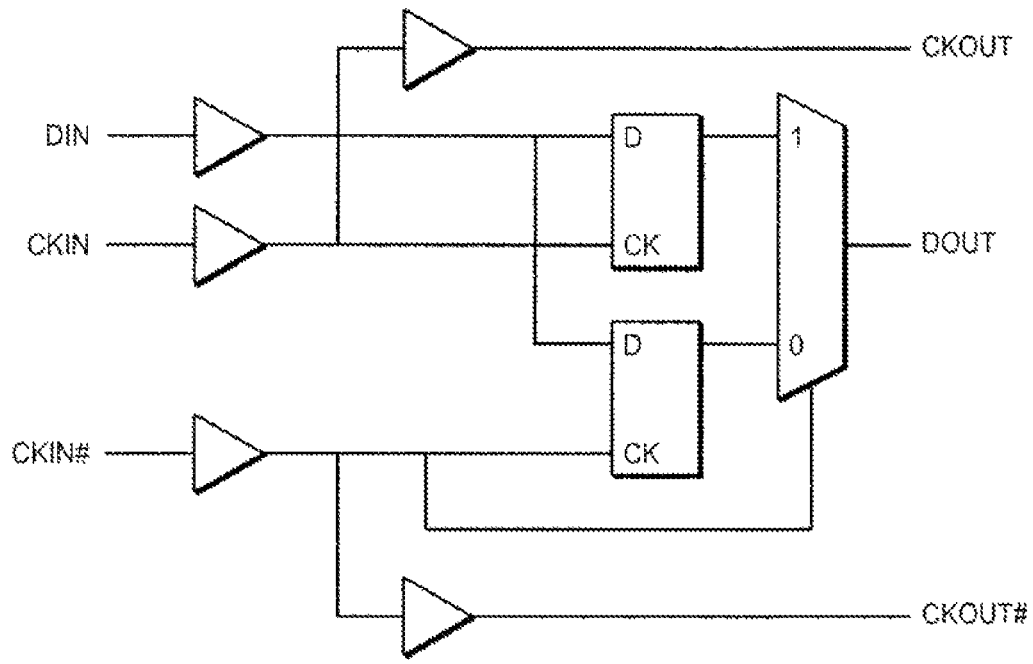

For any of these arrangements, as the signals travel through the branches to the different chips of the tree, the signals should preferably maintain a degree of synchronization. The re-synchronization can be done through a delay-tunable clock buffer arranged such that data are resynchronized. The delay elements, which were not explicitly shown in the earlier figures, can mostly be placed at the input and/or the output of the clock buffer. FIGS. 23A and 23B show two exemplary embodiments of circuits for data propagation with re-synchronization. Both circuits use a double data rate (DDR) arrangement, with data (DIN) and clock (CKIN) inputs and data (DOUT) and clock (CKOUT) outputs. The arrangement of circuit of FIG. 23B additionally includes an inverse for clock signal for propagating through the tree structure, where the inverse for the input and output clocks are shown at CKIN# and CKOUT#.

Figure 24:
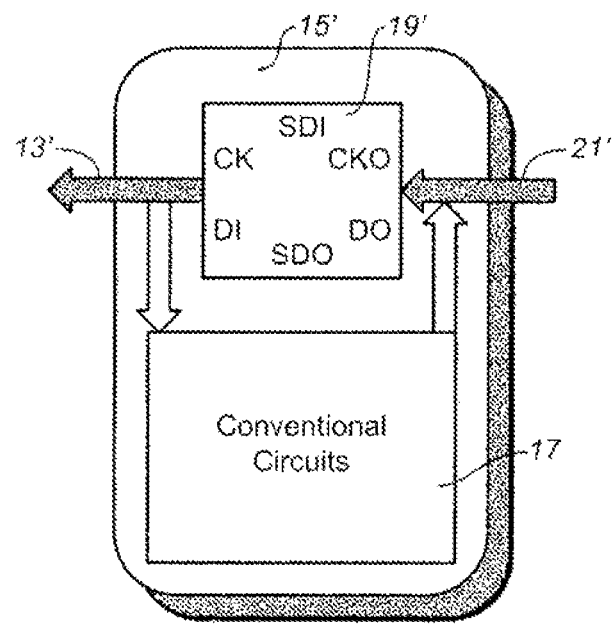
FIGS. 24 and 25 illustrates a pair of additional memory chip modes that can used in alternate embodiments.
Figure 25:
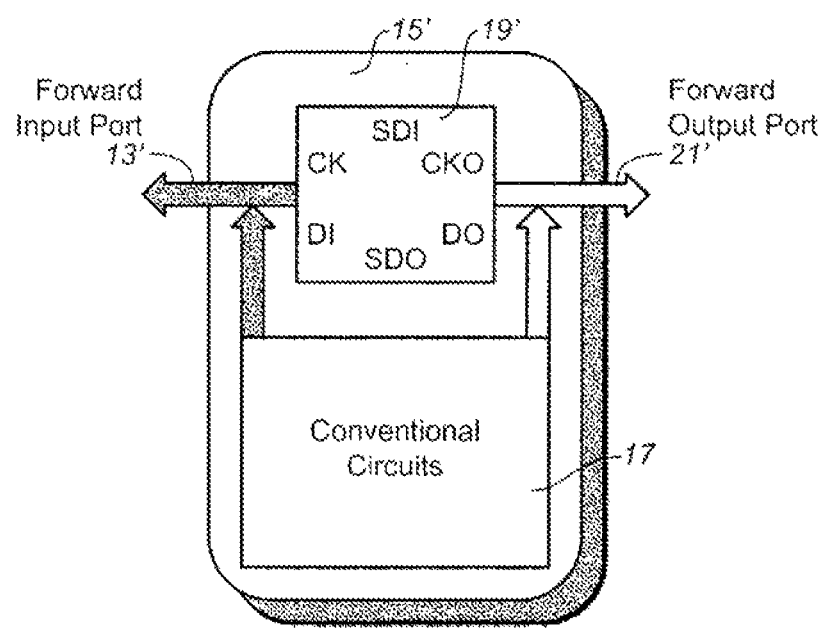
Figure 26:
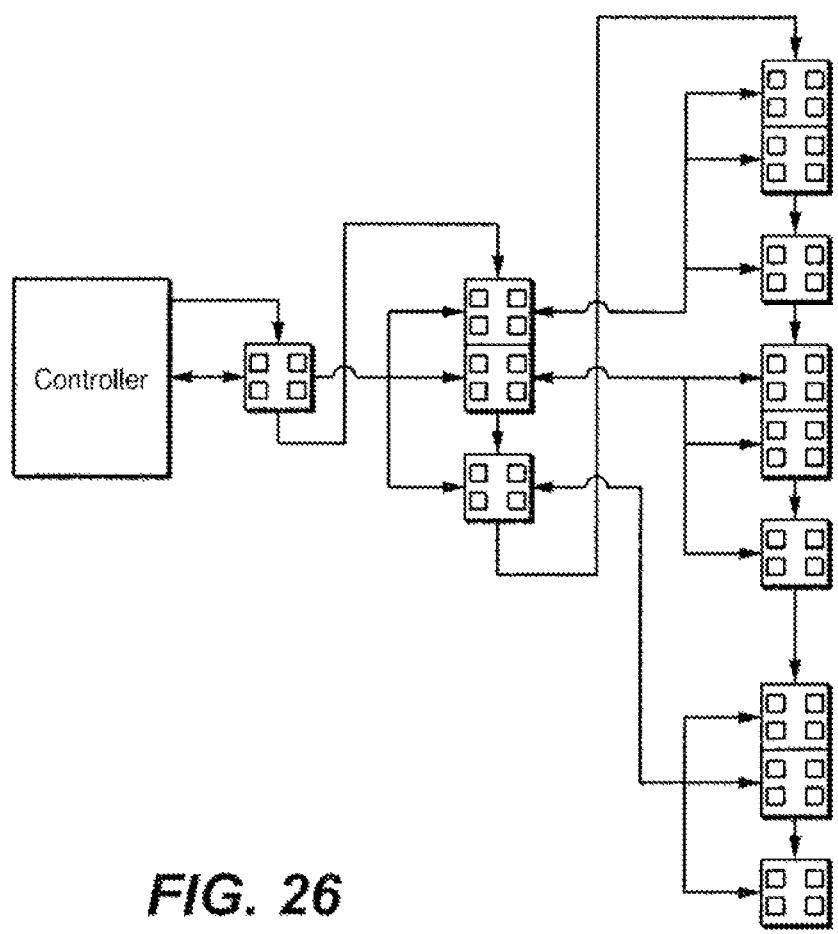
FIG. 26 shows an example of a topology using the modes of FIGS. 24 and 25.
Figure 27:
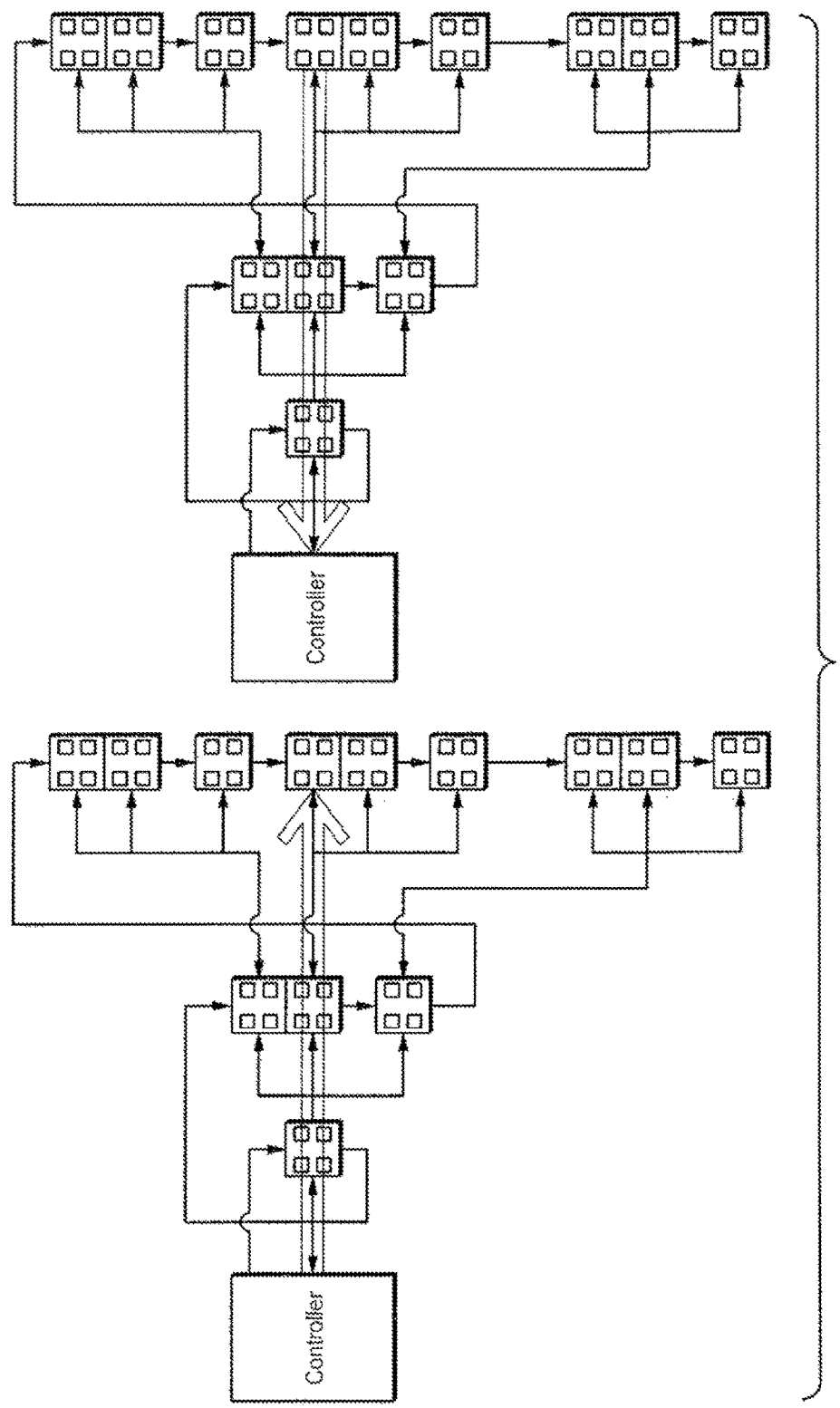
FIG. 27 illustrates the operation of FIG. 26.

FIGS. 24 and 25 illustrates a pair of additional memory chip modes that can used in alternate embodiments, with a corresponding exemplary topology shown in FIG. 26 whose operation is illustrate with respect to FIG. 27. Referring back to FIGS. 4-6, these illustrate a standby mode, a pass-through mode, and an active mode. As described further above, in the pass-through mode, address/commands and data are passed from the input bus 13 to the output bus 21, while the primary circuit section 17 is inactive; and in the active mode, addresses and commands can pass, but the primary circuit section is active where data does not pass, either coming in from the input bus 13 into primary circuit section 17, or out from the primary circuit section 17 on to the output bus 21. In FIGS. 24 and 25, the chip is modified to additionally, or alternately, include a reverse-pass though mode and a reverse active mode. In FIGS. 24 and 25, the corresponding elements are numbered the same as in FIGS. 4-6, but where the primes have been added as the elements 13', 21', and 19' also although a reverse flow, with the input 13' now also can have an output function and conversely for the output 21'.

More specifically, FIG. 24 illustrates a reverse pass-through mode. As with (forward) pass-through mode, the primary circuit section 17 can again be inactive. Data is again passed through, but now in the reverse direction, from the second input/output port connected at 21', clocked through the flip-flop 19' in the reverse direction, and out the first I/O port connected at 13'. In the exemplary embodiment, there is not a need to pass addresses and commands in the reverse direction.

FIG. 25 illustrates a reverse active mode, where, as with the (forward) active mode, the circuit portion 17 is again active, but data is output from the memory via the first I/O part 13', which was only used for input in the (forward) active mode. As with the reverse pass-through mode, there is not a need to pass addresses and commands in the reverse direction. As the reverse-active mode allows for the data to be output from the first I/O node 13', depending on the arrangement of the chips within the memory system, there may no longer be the need to for data also to output at the second I/O port 21'. (This is the case for the arrangements described below with respect to FIGS. 26 and 27.) Consequently, there is not a need for the (forward) active mode to be able to output data at the second I/O port 21', so functionality can be omitted, in which case the active and reverse active modes can be considered as the input and output phases of an active mode. As with the selection of a more traditional or the modes of FIGS. 4-6, the selection of the reverse modes instead of, or in addition to, the arrangements where data goes out the second I/O port can be based on a ROM fuse, a command or commands, a level on one or more pads, and so on.

The inclusion of the reverse modes allows additional topologies to be used. The topologies discussed above mainly looked at the case of a tree like structure where the chips fanned out from a single initial chip, then fanned back down to a final chip and data went in one side (the chip's input bus) and out the other (output bus) as illustrated schematically as a left to right flow in the figures. With the reverse modes, the memory devices can again be structured to fan out in a tree structure, but need not fan back in, where data can be sent back out in the reverse direction to the same "trunk" device, and then out to the controller or host. This is illustrated with respect to FIGS. 26 and 27.

FIG. 26 illustrates an embodiment with a fan out of 3 from each memory device and can be compared to FIG. 8: In both of FIGS. 26 and 8, the outputs of each memory device is connected to the input of 3 additional memory devices for three levels; however, they differ in that FIG. 8 fans back to the final chip, whose output then loops back to the controller. In contrast, FIG. 8 lacks these last two levels of FIG. 8. (As with the earlier figures of this type, FIG. 8 is meant to illustrate the topology of the devices connections, not their actual physical arrangement.) Instead, by adding the two reverse modes, commands and addresses will again flow from controller to the last devices in the last tier, with input data flowing in a similar way; but output data will flow back through the same path as the input data except in the reverse direction, as illustrated schematically in FIG. 27.

The top part of FIG. 27 shows an example of the flow of data and commands for a channel from the controller out to a selected device in the third tier, again based on the addresses and through the use of the serial connections, as illustrated by the large arrow. The lower part of FIG. 27 similarly illustrates the flow of data and responses back to the controller. By using the reverse modes, there is no longer the use of a feedback path as data output from the memory devices flows back the same path as for the input data, effectively reducing the loading on the controller path by half. Under the type of topology illustrated the by FIG. 26 using the reverse modes, because data output from memory devices flows through the same path as data input, there is no need to have the any memory devices receiving input from multiple devices to provide small fan-out to the controller. This allows for a constant fan-out throughout the network, maintaining similar signal integrity throughout the whole network.

For any of the embodiments discussed above, the tree like arrangement can have significant advantages over the more common arrangement illustrated with respect to FIG. 1. In particular, the load stays low and uniform even when large numbers of dies are used on a channel: for example, although the load increases linearly with the number of die for the arrangement of FIG. 1, the tree-like structure presented here has a largely constant load based on the degree of fan out, so that if the number of die in the channel were, say, 200, the worst case load is only a few die rather than the full 200. This can lead to higher performance and allow the use of high clock rates. Although the data and commands may need to propagate through a few tiers to get to a selected device, this only a minor performance penalty as, in addition to higher clock rates, a large degree of parallelism and pipelining can be used in the tree-like structure. Additionally, the use of the tree structure and the ability to put to sleep non-selected devices (as described above with respect to FIGS. 9 and 10) can significantly reduce power consumption of a channel.

A further advantage of the tree-like relates to how defective chips can be handled. Defects will largely occur in the primary circuit portion, rather than more basic circuitry of the interface's flip-flop. If a chip is found to be defective during operation, as long as the DFF portion of the circuit can pass signals, the chips that fan out, the device can be placed into stand-by mode and mapped out. Additionally, under this arrangement, testing procedures can be simplified as the primary circuit portion need not be tested since due to the available high degree of redundancy, any chips that turn out to be defective can just be treated the same devices that fail during later operation by being put into a permanent standby mode.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory package comprising:
    a plurality of external bonding pads, the plurality of external bonding pads comprising a plurality of external input pads and a plurality of external output pads; and
    a plurality of non-volatile memory chips, each of the plurality of non-volatile memory chips comprising a first set of N contact pins and a second set of N contact pins, wherein each of the plurality of non-volatile memory chips is individually configured to operate in either a first configuration in which the first set of N contact pins are input pins and the second set of N contact pins are output pins or a second configuration in which the first set of N contact pins are output pins and the second set of N contact pins are input pins,
    wherein the plurality of non-volatile memory chips comprise:
    a first memory chip, wherein the input pins of the first memory chip are connected to the plurality of external input pads;
    a second memory chip, wherein the output pins of the second memory chip are connected to the plurality of external output pads; and
    one or more additional memory chips between the first memory chip and the second memory chip;
    wherein the output pins of the one or more additional memory chips are connected to the input pins of at least one other memory chip of the one or more additional memory chips; and
    wherein the plurality of non-volatile memory chips are stacked such that the plurality of non-volatile memory chips configured according to the first configuration are interleaved with the plurality of non-volatile memory chips configured according to the second configuration.

2. The non-volatile memory package of claim 1, wherein the plurality of external input pads and the plurality of external output pads are formed along a same edge of the non-volatile memory package.

3. The non-volatile memory package of claim 1, wherein the plurality of external input pads are formed along a different edge of the non-volatile memory package than the plurality of external output pads.

4. The non-volatile memory package of claim 1, further comprising a switchable connection circuit connected to the plurality of external input pads, the plurality of external output pads, the first set of N contact pins, and the second set of N contact pins, wherein the switchable connection circuit is configured to selectively connect the first set of N contact pins and the second set of N contact pins to the plurality of external input pads and the plurality of external output pads to achieve the first configuration and the second configuration.

5. The non-volatile memory package of claim 4, further comprising a configuration pad connected to the switchable connection circuit, wherein based upon a voltage level of the configuration pad, the switchable connection pad connects the first set of N contact pins and the second set of N contact pins to the plurality of external input pads and the plurality of external output pads to achieve the first configuration and the second configuration.

6. The non-volatile memory package of claim 4, wherein the switchable connection circuit connects the first set of N contact pins and the second set of N contact pins to the plurality of external input pads and the plurality of external output pads to achieve the first configuration and the second configuration based upon a command received by the switchable connection circuit.

7. The non-volatile memory package of claim 4, wherein the switchable connection circuit connects the first set of N contact pins and the second set of N contact pins to the plurality of external input pads and the plurality of external output pads to achieve the first configuration and the second configuration based upon a fuse value set within the plurality of non-volatile memory chips.

8. The non-volatile memory package of claim 4, wherein the switchable connection circuit is configured to connect the first set of N contact pins to the plurality of external input pads and the second set of N contact pins to the plurality of external output pads to achieve the first configuration.

9. The non-volatile memory package of claim 4, wherein the switchable connection circuit is configured to connect the first set of N contact pins to the plurality of external output pads and the second set of N contact pins to the plurality of external input pads to achieve the second configuration.

10. The non-volatile memory package of claim 4, wherein the switchable connection circuit comprises an input buffer and an output buffer to facilitate a switch between the first configuration and the second configuration.

11. The non-volatile memory package of claim 1, wherein the plurality of non-volatile memory chips are interconnected according to a tree-like structure where the output pins of at least one of the plurality of non-volatile memory chips are connected to the input pins of multiple other ones of the plurality of non-volatile memory chips and where the input pins of at least one of the plurality of non-volatile memory chips are connected to the output pins of multiple other ones of the plurality of non-volatile memory chips.

12. The non-volatile memory package of claim 11, wherein the tree-like structure comprises a plurality of tiers including a first tier having the first memory chip, a last tier having the second memory chip, and at least one additional tier in between the first tier and the last tier, wherein the first memory chip is connected to the second memory chip via the one or more additional memory chips interconnected in the at least one additional tier.

13. The non-volatile memory package of claim 1, further comprising additional non-volatile memory packages, and wherein all of the non-volatile memory packages are interconnected in a tree-like structure, wherein output ends of a first portion of the non-volatile memory packages are connected to input ends of a second portion of the non-volatile memory packages.

14. The non-volatile memory package of claim 1, wherein each of the plurality of memory chips is serially connected via a serial line.

15. A non-volatile memory system comprising:
a plurality of memory chips, each of the plurality of memory chips having a set of output lines and a set of input lines;
a first set of external contact pads;
a second set of external contact pads;
a switchable connection circuit connected to the first set of external contact pads, the second set of external contact pads, the set of output lines, and the set of input lines in either of a first configuration or a second configuration; and
a configuration pad connected to the switchable connection circuit, wherein a voltage level of the configuration pad controls the switchable connection circuit to switch between the first configuration and the second configuration,
wherein in the first configuration, the set of output lines are connected to the first set of external contact pads and the set of input lines are connected to the second set of external contacts pads;
wherein in the second configuration, the set of input lines are connected to the first set of external contact pads and the set of output lines are connected to the second set of external contact pads;
wherein the plurality of memory chips are configured in a first topology, and
wherein the non-volatile memory system comprises a plurality of memory packages configured in a second topology and each of the plurality of memory packages comprises the plurality of memory chips.

16. The non-volatile memory system of claim 15, wherein the first set of external contact pads and the second set of external contact pads are formed along a same edge of each of the plurality of memory packages.

17. The non-volatile memory system of claim 15, wherein the first set of external contact pads and the second set of external contact pads are formed along different edges of each of the plurality of memory packages.

18. A method comprising:
arranging a plurality of memory chips in a plurality of tiers, wherein each of the plurality of memory chips is serially connected, and wherein each of the plurality of memory chips in each of the plurality of tiers other than a last tier is further connected to at least one of the plurality of memory chips in a next tier via a first set of N contact pins and a second set of N contact pins of each of the plurality of memory chips;
connecting each of the plurality of memory chips for operating in either a first configuration or a second configuration, wherein in the first configuration the first set of N contact pins are input pins and the second set of N contact pins are output pins, and wherein in the second configuration the first set of N contact pins are output pins and the second set of N contact pins are input pins;
connecting, via a switchable connection circuit, the first set of N contact pins to a set of N external input pads and connecting the second set of N contact pins to a set of N external output pads for achieving the first configuration; and
connecting, via the switchable connection circuit, the first set of N contact pins to the set of N external output pads and connecting the second set of N contact pins to the set of N external input pads for achieving the second configuration.

19. The method of claim 18, further comprising adjusting a voltage level of a configuration pad connected to the switchable connection circuit for facilitating the switch between the first configuration and the second configuration.

20. The method of claim 18, further comprising adjusting a fuse value of an internal fuse connected to the switchable connection circuit for facilitating the switch between the first configuration and the second configuration.

* * * * *